(12) United States Patent
Kobayashi et al.

(10) Patent No.: US 11,038,133 B2
(45) Date of Patent: Jun. 15, 2021

(54) ORGANIC EL DISPLAY PANEL, ORGANIC EL DISPLAY DEVICE, AND MANUFACTURING METHOD OF ORGANIC DISPLAY PANEL

(71) Applicant: JOLED INC., Tokyo (JP)

(72) Inventors: Hideki Kobayashi, Tokyo (JP); Jiro Yamada, Tokyo (JP); Kenichi Nendai, Tokyo (JP); Noriteru Maeda, Tokyo (JP); Kenta Fukuoka, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/387,930

(22) Filed: Apr. 18, 2019

(65) Prior Publication Data
US 2019/0326537 A1    Oct. 24, 2019

(30) Foreign Application Priority Data
Apr. 18, 2018   (JP) .............................. JP2018-079914

(51) Int. Cl.
*H01L 51/50* (2006.01)
*H01L 51/52* (2006.01)
(Continued)

(52) U.S. Cl.
CPC ........ *H01L 51/5012* (2013.01); *H01L 27/322* (2013.01); *H01L 27/3211* (2013.01); *H01L 27/3246* (2013.01); *H01L 27/3272* (2013.01); *H01L 51/5056* (2013.01); *H01L 51/5072* (2013.01); *H01L 51/5088* (2013.01); *H01L 51/5218* (2013.01); *H01L 51/5234* (2013.01);
(Continued)

(58) Field of Classification Search
None
See application file for complete search history.

(56) References Cited

U.S. PATENT DOCUMENTS 10,680,047 B2 *   6/2020  Nendai ................. H01L 27/326
2004/0021413 A1   2/2004  Ito et al.
(Continued)

FOREIGN PATENT DOCUMENTS

JP      2004-063359 A    2/2004
JP      2004-139825 A    5/2004
(Continued)

*Primary Examiner* — Telly D Green
(74) *Attorney, Agent, or Firm* — Chip Law Group

(57) ABSTRACT

Disclosed is an organic EL display panel having pixels arranged in matrix includes a substrate, pixel electrodes disposed on the substrate for each of the pixels, insulating layers disposed so as to cover each upper part of the pixel electrodes and having not less than three slit-shaped openings extending and arranged in a column direction, partition walls extending in the column direction and partitioning the pixel electrodes in a row direction, organic functional layers disposed on the pixel electrodes and including organic luminous layers configured to cause electroluminescence in each of the openings, and light transmissive counter electrodes disposed on upper parts of the organic functional layers. Levels of top faces of the partition walls are higher than that of the insulating layers. Row-direction widths of openings adjacent to the partition walls in the row direction are larger than row-direction widths of openings not adjacent to the partition walls.

6 Claims, 23 Drawing Sheets

(51) Int. Cl.
 *H01L 51/56* (2006.01)
 *H01L 27/32* (2006.01)

(52) U.S. Cl.
 CPC ........ *H01L 51/56* (2013.01); *H01L 2227/323* (2013.01)

(56) References Cited

U.S. PATENT DOCUMENTS

| | | |
|---|---|---|
| 2004/0207577 A1 | 10/2004 | Ito et al. |
| 2013/0214301 A1 | 8/2013 | Yamada et al. |
| 2014/0021458 A1 | 1/2014 | Tada et al. |
| 2017/0117339 A1 | 4/2017 | Takata |
| 2019/0371872 A1* | 12/2019 | Nendai ............... H01L 51/5056 |

FOREIGN PATENT DOCUMENTS

| | | |
|---|---|---|
| JP | 2009-158585 A | 7/2009 |
| JP | 2010-160945 A | 7/2010 |
| JP | 2010-160946 A | 7/2010 |
| JP | 2012-074559 A | 4/2012 |
| JP | 2013-030333 A | 2/2013 |
| JP | 2013-191533 A | 9/2013 |
| JP | 2013-206738 A | 10/2013 |
| JP | 2013-240733 A | 12/2013 |
| JP | 2014-060104 A | 4/2014 |
| WO | 2012/133206 A1 | 10/2012 |
| WO | 2015/155971 A1 | 10/2015 |
| WO | WO-2017213012 A1 * | 12/2017 ......... H01L 51/5271 |

* cited by examiner

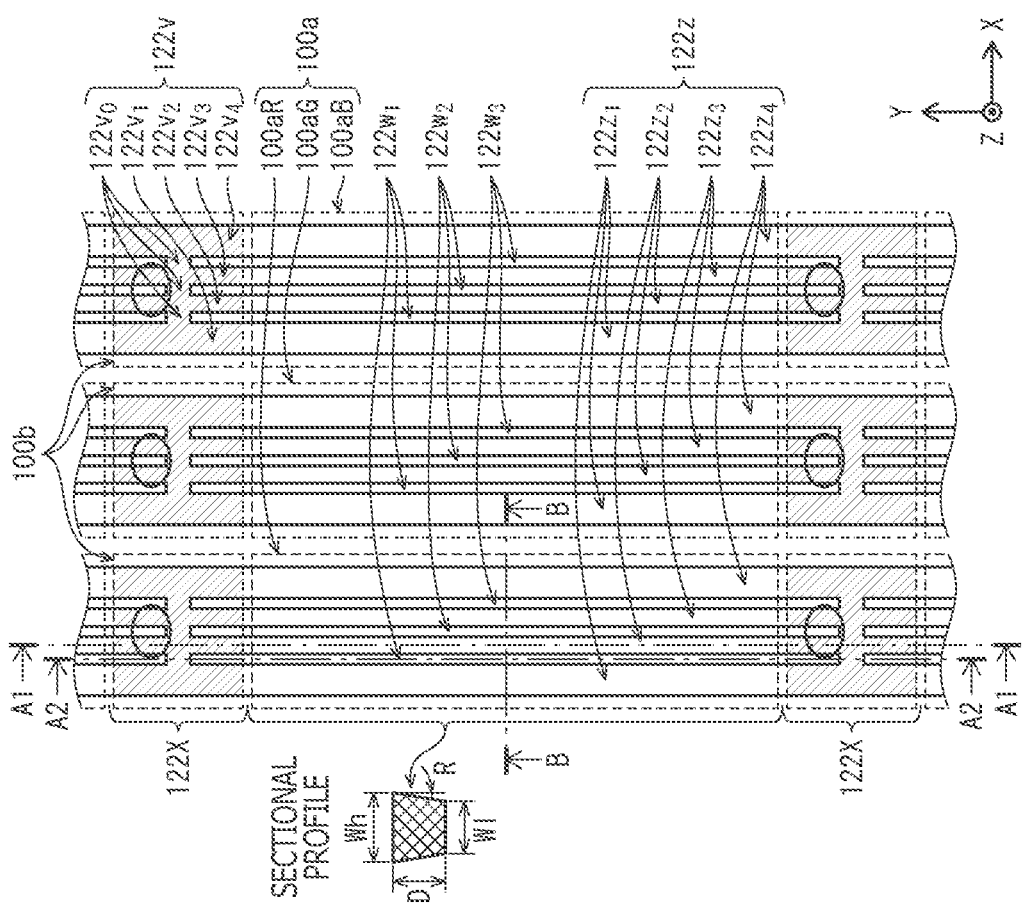
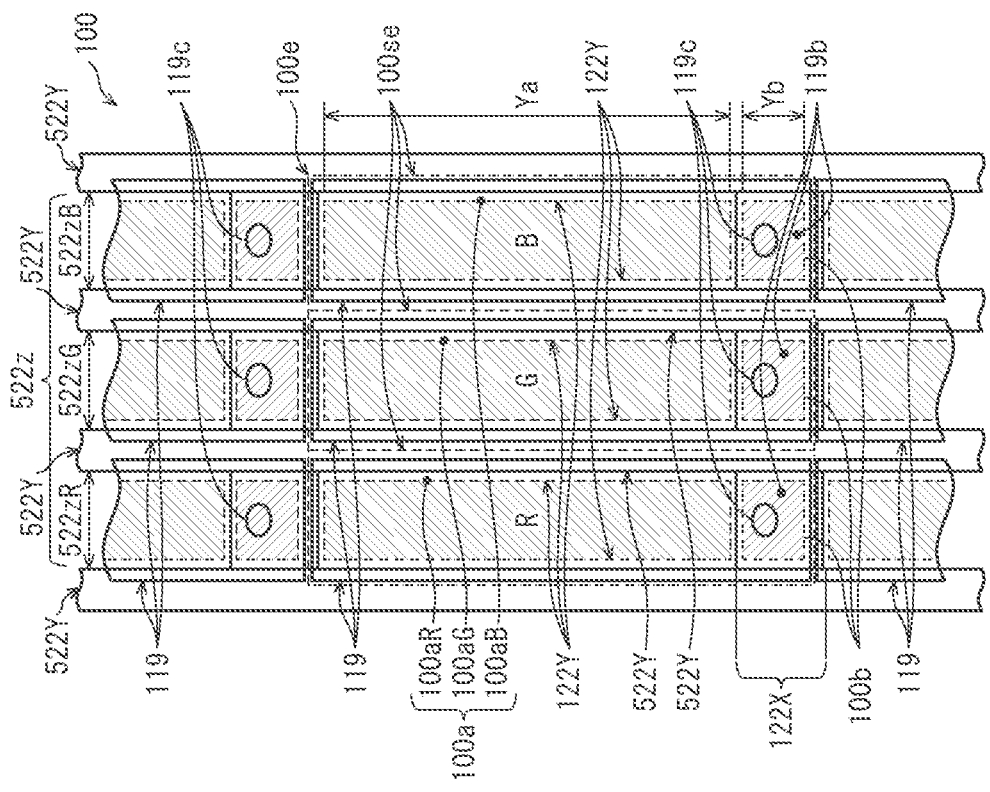
FIG. 4A
FIG. 4B

FIG.15A
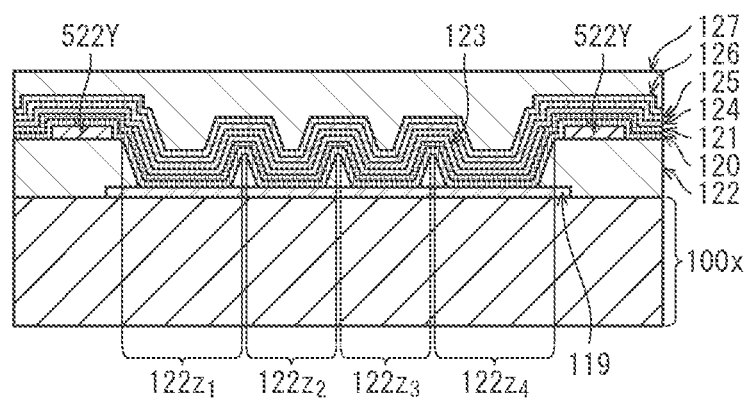
FIG.15B
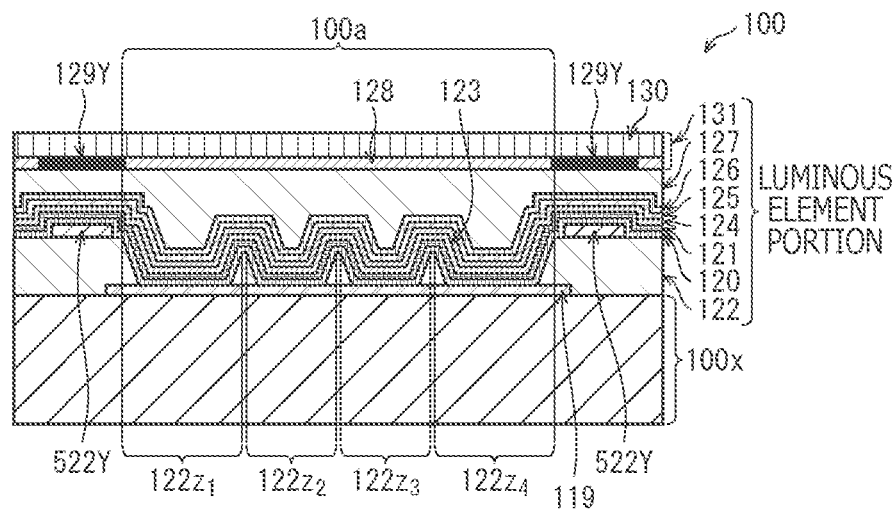
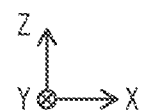

ORGANIC EL DISPLAY PANEL, ORGANIC EL DISPLAY DEVICE, AND MANUFACTURING METHOD OF ORGANIC DISPLAY PANEL

CROSS-REFERENCE TO RELATED APPLICATION

This application claims priority benefit of Japanese Patent Application No. 2018-079914 filed in the Japan Patent Office on Apr. 18, 2018. Each of the above-referenced applications is hereby incorporated herein by reference in its entirety.

BACKGROUND

The present disclosure relates to an organic electroluminescence (EL) display panel equipped with an organic EL element utilizing an electroluminescent phenomenon of an organic material, an organic EL display device, and a manufacturing method therefor.

In recent years, lighting devices and organic EL display devices using organic EL elements as luminous elements have spread. For the organic EL display device, development of a technique for efficiently extracting light is required. This is because improvement of light extraction efficiency allows use of an effective amount of light emitted from an organic EL element, contributing to electric power saving and lifetime extension.

The method for improving the light extraction efficiency includes, for example, a configuration in which an organic EL display device is equipped with a reflector (reflecting structure) as disclosed in Japanese Patent Laid-Open No. 2013-191533 (hereinafter referred to as Patent Document 2).

On the other hand, as a method for efficiently forming a functional layer, for example, the functional layer is formed by applying an ink containing a functional material in a wet process such as an inkjet method as disclosed in Japanese Patent Laid-Open No. 2013-240733 (hereinafter referred to as Patent Document 1). The wet process is characterized in that a positional accuracy in forming the functional layer does not depend on a size of a substrate, which is suitable for production of a large-sized panel and efficient production of a panel by cutting out from a large-sized substrate.

SUMMARY

However, when attempting to form an organic EL element equipped with a reflector by a wet process, an ink is not appropriately spread depending on a structure immediately under a functional layer in some cases. In the wet process, it is not assumed that the ink is applied on an irregular region, and a film thickness of the functional layer may be uneven in the organic EL element. In this case, there are concerns about decreased luminous efficiency and panel lifetime.

A purpose of the present disclosure is to provide an organic EL display panel which has both a functional layer formed in a wet process and a reflector and can maintain both a high film thickness uniformity and a high aperture ratio of the functional layer.

The organic EL display panel according to an aspect of the present disclosure relates to an organic EL display panel having a plurality of pixels arranged in matrix includes a substrate, a plurality of pixel electrodes disposed on the substrate for each of the pixels, insulating layers disposed so as to cover each upper part of the plurality of pixel electrodes and having not less than three slit-shaped openings extending in a column direction and arranged in the column direction, a plurality of partition walls extending in the column direction and partitioning the pixel electrodes in a row direction, organic functional layers disposed on the plurality of pixel electrodes and including organic luminous layers configured to cause electroluminescence in each of the openings, and light transmissive counter electrodes disposed on upper parts of the plurality of organic functional layers, in which levels of top faces of the partition walls with respect to the pixel electrodes are higher than levels of top faces of the insulating layers with respect to the pixel electrodes, and row-direction widths of openings adjacent to the partition walls in the row direction on bottom faces of the insulating layers are larger than row-direction widths of openings not adjacent to the partition walls in the row direction.

An organic EL display device including the organic EL display panel having a plurality of pixels arranged in matrix, the organic EL display panel includes a substrate, a plurality of pixel electrodes disposed on the substrate for each of the pixels, insulating layers disposed so as to cover each upper part of the plurality of pixel electrodes and having not less than three slit-shaped openings extending in a column direction and arranged in the column direction, a plurality of partition walls extending in the column direction and partitioning the pixel electrodes in a row direction, organic functional layers disposed on the plurality of pixel electrodes and including organic luminous layers configured to cause electroluminescence in each of the openings, and light transmissive counter electrodes disposed on upper parts of the plurality of organic functional layers, in which levels of top faces of the partition walls with respect to the pixel electrodes are higher than levels of top faces of the insulating layers with respect to the pixel electrodes, and row-direction widths of openings adjacent to the partition walls in the row direction on bottom faces of the insulating layers are larger than row-direction widths of openings not adjacent to the partition walls in the row direction.

A manufacturing method for the organic EL display panel having a plurality of pixels arranged in matrix includes preparing a substrate, forming a plurality of pixel electrodes in matrix on the substrate, forming insulating layers having not less than three slit-shaped openings arranged in a row direction along a column direction so as to cover each upper part of the pixel electrodes, forming a plurality of partition walls extending in the column direction and partitioning the pixel electrodes in the row direction, forming organic functional layers including organic luminous layers in the plurality of openings, by applying an ink containing a material while scanning at least one of the substrate and a coater in the row direction, and forming light transmissive counter electrodes on upper parts of the plurality of organic functional layers, in which levels of top faces of the partition walls with respect to the pixel electrodes are formed higher than levels of top faces of the insulating layers with respect to the pixel electrodes, and row-direction widths of openings adjacent to the partition walls in the row direction on bottom faces of the insulating layers are larger than row-direction widths of openings not adjacent to the partition walls in the row direction, in the forming the insulating layers.

The organic EL display panel according to an aspect of the present disclosure allows uniformization of volumes of an ink as a functional layer material per a bottom area among the slit-shaped openings which are bottom faces of the reflectors. Thus, the film thicknesses of the functional layers can be uniformized among a plurality of the openings on one pixel electrode, so that luminous efficiency and panel lifetime can be improved. In addition, since the level of the top face of the insulating layer is lower than the level of the top face of the partition wall, decrease of an aperture ratio resulting from the film thickness of the insulating layer can be prevented.

BRIEF DESCRIPTION OF THE DRAWINGS

FIG. 4A is an enlarged plan view of a part X in FIG. 3, illustrating one pixel in the display panel;

FIG. 4B is an enlarged plan view of a part X in FIG. 3, illustrating each subpixel in the pixel;

FIG. 15A is a schematic sectional view taken along the same line B-B in FIG. 4B, illustrating a state at a step of forming the bonding layer in production of the organic EL display panel;

FIG. 15B is a schematic sectional view taken along the same line B-B in FIG. 4B, illustrating a state at a step of bonding the CF substrate in production of the organic EL display panel;

DETAILED DESCRIPTION OF THE PREFERRED EMBODIMENTS

«Circumstance Leading to an Aspect of the Present Disclosure»

The technique for improving the light extraction efficiency of the organic EL display panel can be exemplified by a technique adopting a structure having a reflector (reflecting structure) as disclosed in Patent Document 2. Patent Document 2 discloses a structure in which a reflector is disposed for each of subpixels constituting each pixel, but for the purpose of improving the effect of the reflector, a structure in which a plurality of reflectors are disposed in the subpixel has been studied. In this case, a reflector structure can be formed by a method in which an interpixel insulating layer is disposed between a pixel electrode and a functional layer, and a plurality of micropixels having the reflectors are formed in the subpixel.

Figure 23A:
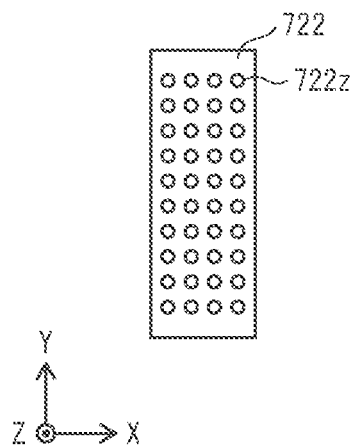
FIG. 23A is a plane view of the insulating layer on a conventional subpixel.
Figure 23B:
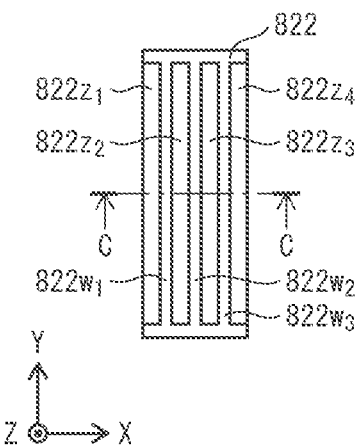
FIG. 23B is a plane view of the insulating layer on a conventional subpixel.

On the other hand, for example, as disclosed in Patent Document 1, there is an attempt to form functional layers such as a luminous layer, a carrier injection layer, and a carrier transport layer on a large-sized panel by a wet process. However, when functional layers are formed by the wet process, the ink should be uniformly spread over the entire subpixel. However, when the functional layers are formed on a face having a plurality of recessed portions like the top face of the interpixel insulating layer by a wet process, the top face of the interpixel insulating layer disturbs spread of the ink as a functional layer material, and in particular, the smaller the recessed portions of the interpixel insulating layer are, the harder the ink is spread. Thus, for the purpose of increasing the light extraction efficiency of the reflector, it is preferable that the recessed portions as micropixels are small, the number of the recessed portions is large, and the recessed portions are isotropic with respect to a direction parallel to the plane. Specifically, a configuration in which a plurality of frustoconical recessed portions 722z are arranged in matrix on an interpixel insulating layer 722 in the plan view direction of the interpixel insulating layer as illustrated in FIG. 23A is preferable. However, with the configuration illustrated in FIG. 23A, there are some cases that the ink is not sufficiently spread, and the film thickness of the functional layer becomes ununiform. In addition, there is a case where the whole or a part of the functional layer is chipped and a micropixel becomes a dark spot. Hence, as a configuration for improving spread of the ink while reducing the decrease in the light extraction efficiency of the reflector, a configuration in which a plurality of elongated recessed portions are arranged in parallel has been studied. Specifically, a configuration in which recessed portions 822z1 to 822z4 extending in the column direction are arranged in the row direction on an interpixel insulating layer 822 in the plan view direction of the interpixel insulating layer as illustrated in FIG. 23B, is adopted. Such a configuration allows the ink to flow in the column direction, and thus the spread of the ink can be improved. Particularly, in the so-called line bank method in which water-repellent partition walls for partitioning subpixels extend in the column direction, it is premised that the ink dripped at an interval in the column direction flows in the column direction, and thus a degree of spread can be improved by conforming the extending direction of the partition walls with the extending direction of the openings. In the configuration illustrated in FIG. 23B, the recessed portions 822z1 and 822z4 which are both ends in the column direction are brought into contact with the partition walls on the top face of the interpixel insulating layer 822. Such a configuration enlarges a bottom area of the micropixel in the subpixel and improves an aperture ratio.

However, the inventors of the present disclosure have found the following problems in further improving the efficiency of the organic EL element. When not less than three elongated recessed portions are formed on the interpixel insulating layer, the following problems are caused.

Figure 23C:
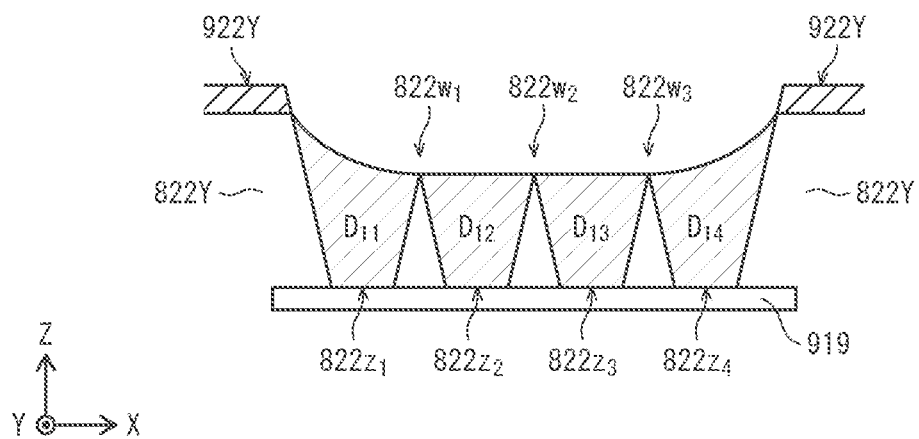
FIG. 23C is an example of a schematic sectional view taken along C-C in FIG. 23B.
Figure 23D:
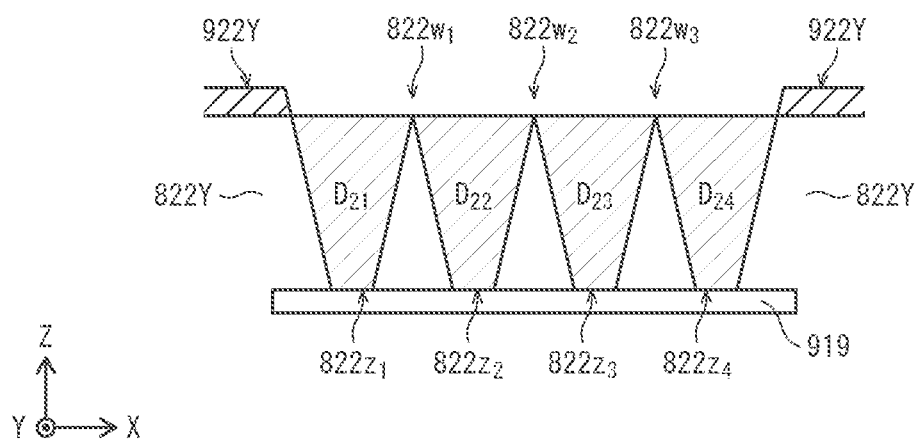
FIG. 23D is another example of a schematic sectional view taken along C-C in FIG. 23B.

FIG. 23C illustrates one configuration taken along the C-C cross section in FIG. 23B, in which the levels of the top faces of crosspieces $822w1$ to $822w3$ disposed on the interpixel insulating layer 822 with respect to the pixel electrode are lower than the level of the pinning position (a boundary between an insulating layer 822Y and a column-direction bank 92Y) on the partition wall. At this time, the ink applied to the recessed portions $822z2$ and $822z3$ is pinned on the top face $822w2$ of the crosspiece and the top face $822w1$ or $822w3$ of the crosspieces during drying. On the other hand, at the center of the subpixel, the ink applied on the recessed portions $822z1$ and $822z4$ is pinned on the top faces of the crosspieces $822w1$ and $822w3$ during drying, meanwhile on the partition wall side, the ink is pinned on the boundary between the insulating layer 822Y and the column-direction bank 922Y. Thus, when the row-direction widths of the respective recessed portions are uniform, the volumes of the recessed portions up to the top faces $822w1$ to $822w3$ of the interpixel insulating layers are uniform, nevertheless volumes D11 and D14 of the ink remaining in the recessed portions $822z1$ and $822z4$ adjacent to the partition walls are larger than volumes D12 and D13 of the ink remaining in the other recessed portions $822z2$ and $822z3$. Thereby, the film thicknesses of the functional layers in the recessed portions $822z1$ and $822z4$ closest to the partition walls are larger than the film thicknesses of the functional layers in the other recessed portions $822z2$ and $822z3$. As a result, while an amperage and a luminance are decreased due to an increased electrical resistivity in the micropixel adjacent to the partition wall, the current concentrates in the other micropixels, resulting in shortened lifetime of the organic EL element. On the other hand, FIG. 23D illustrates another configuration taken along the C-C cross section in FIG. 23B, in which the levels of the top faces of the crosspieces $822w1$ to $822w3$ disposed in the interpixel insulating layer 822 with respect to the pixel electrode are as high as the levels of the boundary between the insulating layer 822Y and the column-direction bank 922Y. At this time, since the levels of the top faces of the crosspieces $822w1$ to $822w3$ are as high as the levels of the boundary between the insulating layer 822Y and the column-direction bank 922Y, ununiformity between the volumes D21 and D24 of the ink remaining in the recessed portions $822z1$ and $822z4$ adjacent to the partition walls and the volumes D22 and D23 of the ink remaining in the other recessed portions $822z2$ and $822z3$ is not caused, and ununiformity in the film thicknesses of the functional layers for the respective micropixels can be reduced. However, the optimum range for the inclination of the side face of the opening is determined depending on the physical properties of the constituent materials for the organic EL element, and thus the greater the deviation degree of the inclination from the appropriate range is, the lower the light extraction efficiency becomes. Consequently, when the light extraction efficiency is maximized, the higher the levels of the top faces of the crosspieces $822w1$ to $822w3$ are, the larger the bottom areas of the crosspieces $822w1$ to $822w3$ are, and therefore an area of a part not covered with the interpixel insulating layer 822 in a pixel electrode 919 is decreased, and the aperture ratio is decreased. Consequently, in the configuration illustrated in FIG. 23D, since the aperture ratio is decreased compared to the configuration illustrated in FIG. 23C, ununiformity in the film thicknesses of the functional layers can be reduced, but on the other hand, there is a problem that the luminance of the subpixel is decreased due to minimization of the luminous area.

In view of the above problems, the organic EL panel according to an aspect of the present disclosure has a configuration in which both improvement of aperture ratio and suppression of ununiformity in the film thicknesses of functional layers between micropixels can be achieved.

«Aspects of the Present Disclosure»

The organic EL display panel according to an aspect of the present disclosure is an organic EL display panel having a plurality of pixels arranged in matrix includes a substrate, a plurality of pixel electrodes disposed on the substrate for each of the pixels, insulating layers disposed so as to cover each upper part of the plurality of pixel electrodes and having not less than three slit-shaped openings extending in a column direction and arranged in the column direction, a plurality of partition walls extending in the column direction and partitioning the pixel electrodes in a row direction, organic functional layers disposed on the plurality of pixel electrodes and including organic luminous layers configured to cause electroluminescence in each of the openings, and light transmissive counter electrodes disposed on upper parts of the plurality of organic functional layers, in which levels of top faces of the partition walls with respect to the pixel electrodes are higher than levels of top faces of the insulating layers with respect to the pixel electrodes, and row-direction widths of openings adjacent to the partition walls in the row direction on bottom faces of the insulating layers are larger than row-direction widths of openings not adjacent to the partition walls in the row direction.

In the organic EL display panel according to an embodiment of the present disclosure, volumes of an ink as a functional layer material per a bottom area are uniformized among the slit-shaped openings which are bottom faces of reflectors. Thus, film thicknesses of the functional layers can be uniformized among the plurality of openings on one pixel electrode, so that luminous efficiency and panel lifetime can be improved. In addition, since the levels of the top faces of the insulating layers are lower than the levels of the top faces of the partition walls, decrease of an aperture ratio resulting from film thicknesses of the insulating layers can be prevented.

The organic EL display panel according to another aspect of the present disclosure is an organic EL display panel having a plurality of pixels arranged in matrix includes a substrate, a plurality of pixel electrodes disposed on the substrate for each of the pixels, insulating layers disposed so as to cover each upper part of the plurality of pixel electrodes and having a plurality of slit-shaped openings extending in a column direction and arranged in the column direction, a plurality of partition walls extending in the column direction and partitioning the pixel electrodes in a row direction, organic functional layers disposed on the plurality of pixel electrodes and including organic luminous layers configured to cause electroluminescence in each of the openings, and light transmissive counter electrodes disposed on upper parts of the plurality of organic functional layers, in which the number of the openings is an even number of not less than four, row-direction widths of the respective openings in the bottom faces of the insulating layers are substantially equal, and when partition regions for partitioning the openings adjacent to each other on the insulating layers are numbered in the row direction using one of the partition walls as a reference, heights of the insulating layers with respect to the pixel electrodes on the partition regions located at odd-numbered positions are lower than heights of the partition walls with respect to the pixel electrodes, and lower than heights of the insulating layers with respect to the pixel electrodes on the partition regions located at even-numbered positions.

Also, in the organic EL display panel according to another aspect of the present disclosure, volumes of an ink as a functional layer material per a bottom area are uniformized among the slit-shaped openings which are bottom faces of reflectors. Thus, film thicknesses of the functional layers can be uniformized among the plurality of openings on one pixel electrode, so that luminous efficiency and panel lifetime can be improved. In addition, since a level of a partial top face of the insulating layers is lower than a level of a top face of the partition wall, decrease of an aperture ratio resulting from a film thickness of the insulating layer can be prevented.

In another aspect, the heights of the insulating layers with respect to the pixel electrodes on the partition regions located at the even-numbered positions are substantially equal to the heights of the partition walls with respect to the pixel electrodes.

According to this aspect, the volumes of the ink as the functional layer material per an opening can be uniformized among the slit-shaped openings which are the bottom faces of the reflectors. Thus, ununiformity in the film thicknesses of the functional layers can be reduced.

The organic EL display panel according to another aspect of the present disclosure is an organic EL display panel having a plurality of pixels arranged in matrix includes a substrate, a plurality of pixel electrodes disposed on the substrate for each of the pixels, insulating layers disposed so as to cover each upper part of the plurality of pixel electrodes and having a plurality of slit-shaped openings extending in a column direction and arranged in the column direction, a plurality of partition walls extending in the column direction and partitioning the pixel electrodes in a row direction, organic functional layers disposed on the plurality of pixel electrodes and including organic luminous layers configured to cause electroluminescence in each of the openings, and light transmissive counter electrodes disposed on upper parts of the plurality of organic functional layers, in which the number of the openings corresponds to a product of two numbers p and q (p is an integer of not less than 3, and q is an integer of not less than 2), when partition regions for partitioning the openings adjacent to each other on the insulating layers are numbered in the row direction using one of the partition walls as a reference, heights of the insulating layers with respect to the pixel electrodes on the partition regions not located at the (m×p)-numbered positions (m is an integer of not less than 1 and less than q) are lower than heights of the partition walls with respect to the pixel electrodes, and lower than heights of the insulating layers with respect to the pixel electrodes on the partition regions located at the (m×p)-numbered positions, and on bottom faces of the insulating layers, row-direction widths of openings adjacent to either of the partition walls or the partition regions located at the (m×p)-numbered positions in the row direction are larger than row-direction widths of openings adjacent to neither of the partition walls nor the partition regions located at the (m×p)-numbered positions in the row direction.

Also, in the organic EL display panel according to another aspect of the present disclosure, volumes of an ink as a functional layer material per a bottom area are uniformized among the slit-shaped openings which are bottom faces of reflectors. Thus, film thicknesses of the functional layers can be uniformized among the plurality of openings on one pixel electrode, so that luminous efficiency and panel lifetime can be improved. In addition, since a level of a partial top face of the insulating layer is lower than a level of a top face of the partition wall, decrease of an aperture ratio resulting from a film thickness of the insulating layer can be prevented.

In another aspect, the partition regions located at the (m×p)-numbered positions can have substantially the same configuration as the partition walls.

According to this aspect, volumes of the ink as the functional layer material per an opening can be uniformized between the openings adjacent to the partition walls and openings adjacent to the partition regions located at the (m×p)-numbered positions. Thus, ununiformity in the film thicknesses of the functional layers can be reduced.

In another aspect, for each of the plurality of openings, when a sectional area of the opening on a cross section of the insulating layer in the row direction is defined as D and a row-direction width of the opening on the bottom face of the insulating layer is defined as W, a value of P defined by P=D/W can be within a predetermined range for any of the openings.

According to this aspect, ununiformity in the film thicknesses of the functional layers can be reduced.

In another aspect, the organic luminous layer includes a first organic luminous layer for emitting light with a first luminescent color and a second organic luminous layer for emitting light with a second luminescent color, and the pixel electrode on which the first organic luminous layer is disposed and the pixel electrode on which the second organic luminous layer is disposed can be partitioned from each other by the partition wall.

According to this aspect, color mixing of the first organic luminous layer and the second organic luminous layer can be prevented by the partition walls, an arrangement direction of ink droplets related to the organic luminous layer is the same as an extending direction of the openings during formation of the organic luminous layer, and thus defective formation of the organic functional layer due to non-adhesion of the ink can be prevented.

In another aspect, the number of the openings in one pixel and the number of the openings in the pixel adjacent to the one pixel in the column direction are equal, and at least one of the openings in the one pixel can communicate with any one of the openings in the pixel adjacent to the one pixel in the column direction.

According to this aspect, ink as materials for the organic functional layers can flow between the pixels, and thus ununiformity in the film thicknesses of the organic functional layers in the column direction can be prevented.

In another aspect, the plurality of openings in one pixel can communicate between the one pixel and the pixel adjacent to the one pixel in the column direction.

According to this aspect, the inks as the materials for the organic functional layers can flow between the plurality of openings in the same pixel, and thus ununiformity in the film thicknesses of the organic functional layers in the row direction can be further prevented.

The organic EL display panel according to another aspect of the present disclosure is an organic EL display panel having a plurality of pixels arranged in matrix includes a substrate, a plurality of pixel electrodes disposed on the substrate for each of the pixels, insulating layers disposed so as to cover each upper part of the plurality of pixel electrodes and having a plurality of frustoconical or pyramidal trapezoidal openings arranged in matrix, organic functional layers disposed on the plurality of pixel electrodes and including organic luminous layers configured to cause electroluminescence in each of the openings, and light transmissive counter electrodes disposed on upper parts of the plurality of organic functional layers, in which the insulating layers have slopes extending toward the counter electrode and spreading toward a periphery of the pixel around the openings, and the sectional areas of the openings arranged at an outermost periphery of the pixel in a plan view direction of the insulating layer are larger than the sectional areas of the other openings.

Also, in the organic EL display panel according to another aspect of the present disclosure, the volumes of the ink as the functional layer material per the bottom area are uniformized among the plurality of openings which are the bottom faces of the reflectors. Thus, the film thicknesses of the functional layers can be uniformized among the plurality of openings on one pixel electrode, so that the luminous efficiency and the panel lifetime can be improved.

The organic EL display device according to an aspect of the present disclosure is an organic EL display device including an organic EL display panel according to an aspect or another aspect of the present disclosure.

The manufacturing method for the organic EL display panel according to an aspect of the present disclosure is a manufacturing method for an organic EL display panel having a plurality of pixels arranged in matrix includes preparing a substrate, forming a plurality of pixel electrodes in matrix on the substrate, forming insulating layers having not less than three slit-shaped openings arranged in a row direction along a column direction so as to cover each upper part of the pixel electrodes, forming a plurality of partition walls extending in the column direction and partitioning the pixel electrodes in the row direction, forming organic functional layers including organic luminous layers in the plurality of openings, by applying an ink containing a material while scanning at least one of the substrate and a coater in the row direction, and forming light transmissive counter electrodes on upper parts of the plurality of organic functional layers, in which levels of top faces of the partition walls with respect to the pixel electrodes are formed higher than levels of top faces of the insulating layers with respect to the pixel electrodes, and row-direction widths of openings adjacent to the partition walls in the row direction on bottom faces of the insulating layers are larger than row-direction widths of openings not adjacent to the partition walls in the row direction, in forming the insulating layers.

The manufacturing method for the organic EL display panel according to another aspect of the present disclosure is a manufacturing method for an organic EL display panel having a plurality of pixels arranged in matrix includes preparing a substrate, forming a plurality of pixel electrodes in matrix on the substrate, forming insulating layers having a plurality of slit-shaped openings arranged in a row direction along a column direction so as to cover each upper part of the pixel electrodes, and forming a plurality of partition walls extending in the column direction and partitioning the pixel electrodes in the row direction, in which an even number of and not less than four openings are formed such that row-direction widths of the respective openings on bottom surfaces of the insulating layers are substantially equal, and among portions for partitioning two adjacent openings on the insulating layers, heights of portions located at odd-numbered positions from the partition wall are made lower, and heights of portions located at even-numbered positions are made higher in forming the insulating layers.

Such a configuration allows production of the organic EL display panel according to an aspect or another aspect of the present disclosure.

Embodiments

1 Circuit Configuration
1.1 Circuit Configuration of Display Device 1

Hereinafter, a circuit configuration of an organic EL display device 1 (hereinafter referred to as "display device 1") according to the present embodiments will be explained with reference to FIG. 1.

Figure 1:
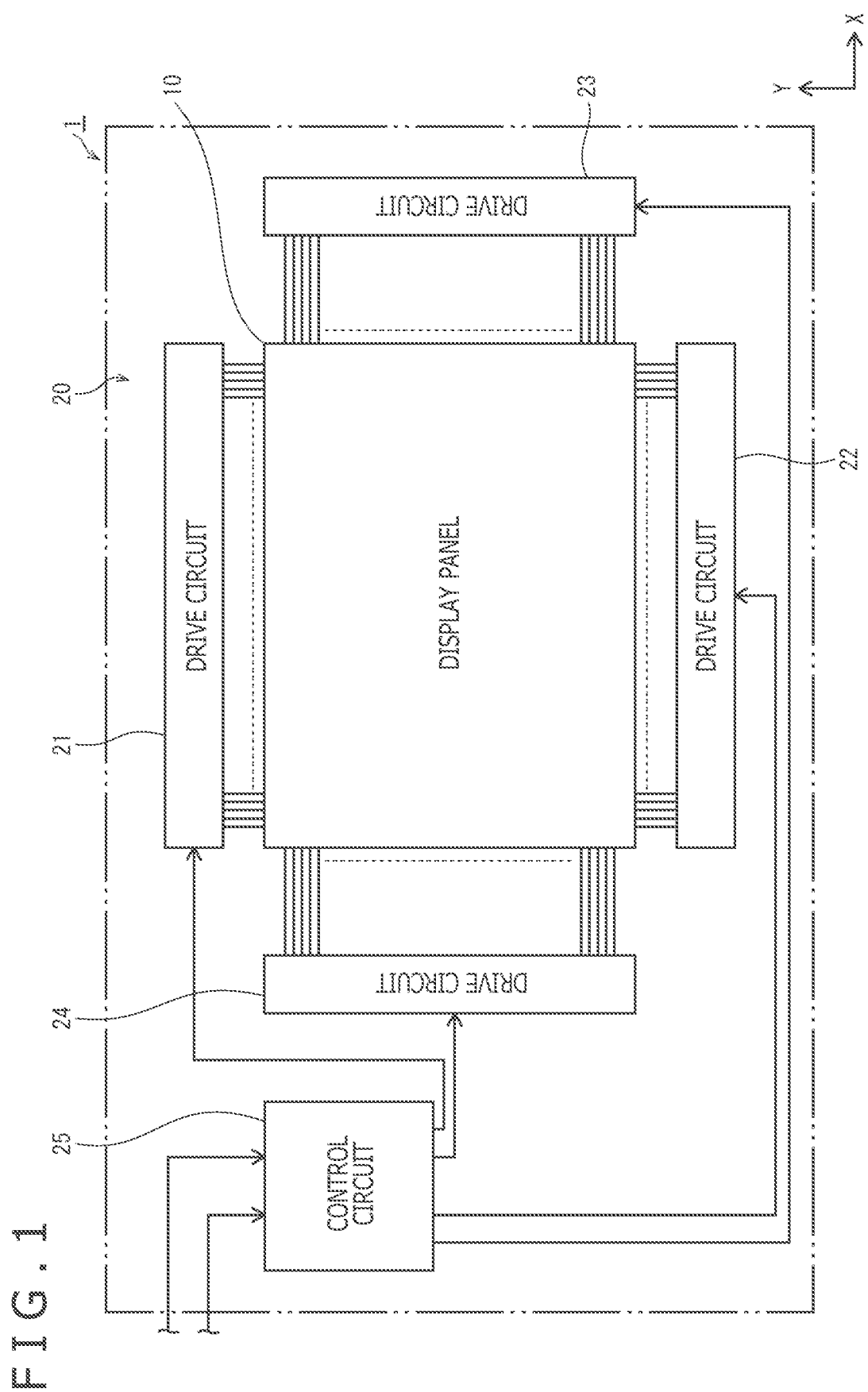
FIG. 1 is a schematic block diagram illustrating a circuit configuration of an organic EL display device according to an embodiment.

As illustrated in FIG. 1, the display device 1 has a configuration including an organic EL display panel 10 (hereinafter referred to as "display panel 10"), and a drive control circuit portion 20 connected to the display panel 10.

The display panel 10 is an organic EL panel utilizing an electroluminescent phenomenon of an organic material, having a configuration in which a plurality of organic EL elements are arranged, for example, in matrix. The drive control circuit portion 20 is composed of four drive circuits 21 to 24 and a control circuit 25.

Note that, in the display device 1, the arrangement of each circuit of the drive control circuit portion 20 relative to the display panel 10 is not limited to the arrangement illustrated in FIG. 1.

1.2 Circuit Configuration of Display Panel 10

The plurality of organic EL elements in the display panel 10 are composed of three color subpixels (not illustrated in the figure) emitting lights of R (red), G (green), and B (blue). The circuit configuration of each subpixel 100*se* will be explained with reference to FIG. 2.

Figure 2:
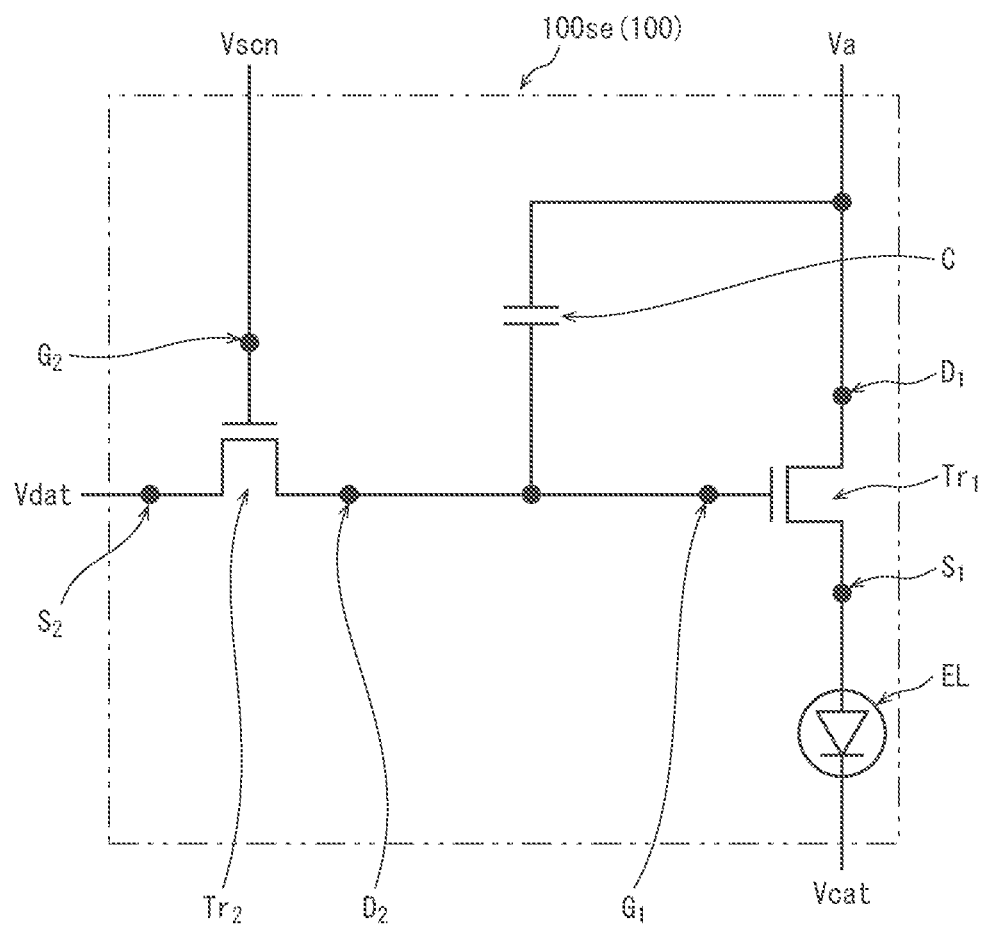
FIG. 2 is a schematic circuit diagram illustrating a circuit configuration in each subpixel in an organic EL display panel used for the organic EL display device.

FIG. 2 is a schematic circuit diagram illustrating a circuit configuration in an organic EL element 100 corresponding to each subpixel 100*se* in the display panel 10 used for the display device 1. In the display panel 10, the organic EL elements 100 constituting a pixel 100*e* are arranged in matrix to constitute a display region.

As illustrated in FIG. 2, the display panel 10 according to the present embodiment has a configuration in which each subpixel 100*se* includes two transistors Tr1 and Tr2, one capacitor C, and an organic EL element portion EL as a luminous portion. The transistor Tr1 is a drive transistor, and the transistor Tr2 is a switching transistor.

A gate G2 of the switching transistor Tr2 is connected to a scanning line Vscn, and a source S2 is connected to a data line Vdat. A drain D2 of the switching transistor Tr2 is connected to a gate G1 of the drive transistor Tr1.

A drain D1 of the drive transistor Tr1 is connected to a power source line Va, and a source S1 is connected to a pixel electrode layer (anode) of the EL element portion EL. A counter electrode layer (cathode) of the EL element portion EL is connected to a grounding line Vcat.

The capacitor C is disposed so as to connect the drain D2 of the switching transistor Tr2 and the gate G1 of the drive transistor Tr1 with the power source line Va.

In the display panel 10, one unit pixel 100*e* is configured by combining a plurality of adjacent subpixels 100*se* (e.g. three subpixels 100*se* of luminescent colors red (R), green (G), and blue (B)), and a pixel region is configured such that respective subpixels 100*se* are arranged to be distributed. From the gate G2 of each subpixel 100*se*, each gate line GL is drawn out, and connected to the scanning line Vscn which is connected from the outside of the display panel 10. Similarly, from the source S2 of each subpixel 100*se*, each source line SL is drawn out, and connected to the data line Vdat which is connected from the outside of the display panel 10.

In addition, the power source lines Va of the respective subpixels 100*sa* and the grounding lines Vcat of the respective subpixels 100*se* are aggregated, and connected to the power source lines Va and the grounding lines Vcat respectively.

3. Overall Configuration of Organic EL Display Panel 10

The display panel 10 according to the present embodiment will be explained with reference to the drawings. Note that the drawings are schematic diagrams, and the scales are different from the actual scales in some cases.

Figure 3:
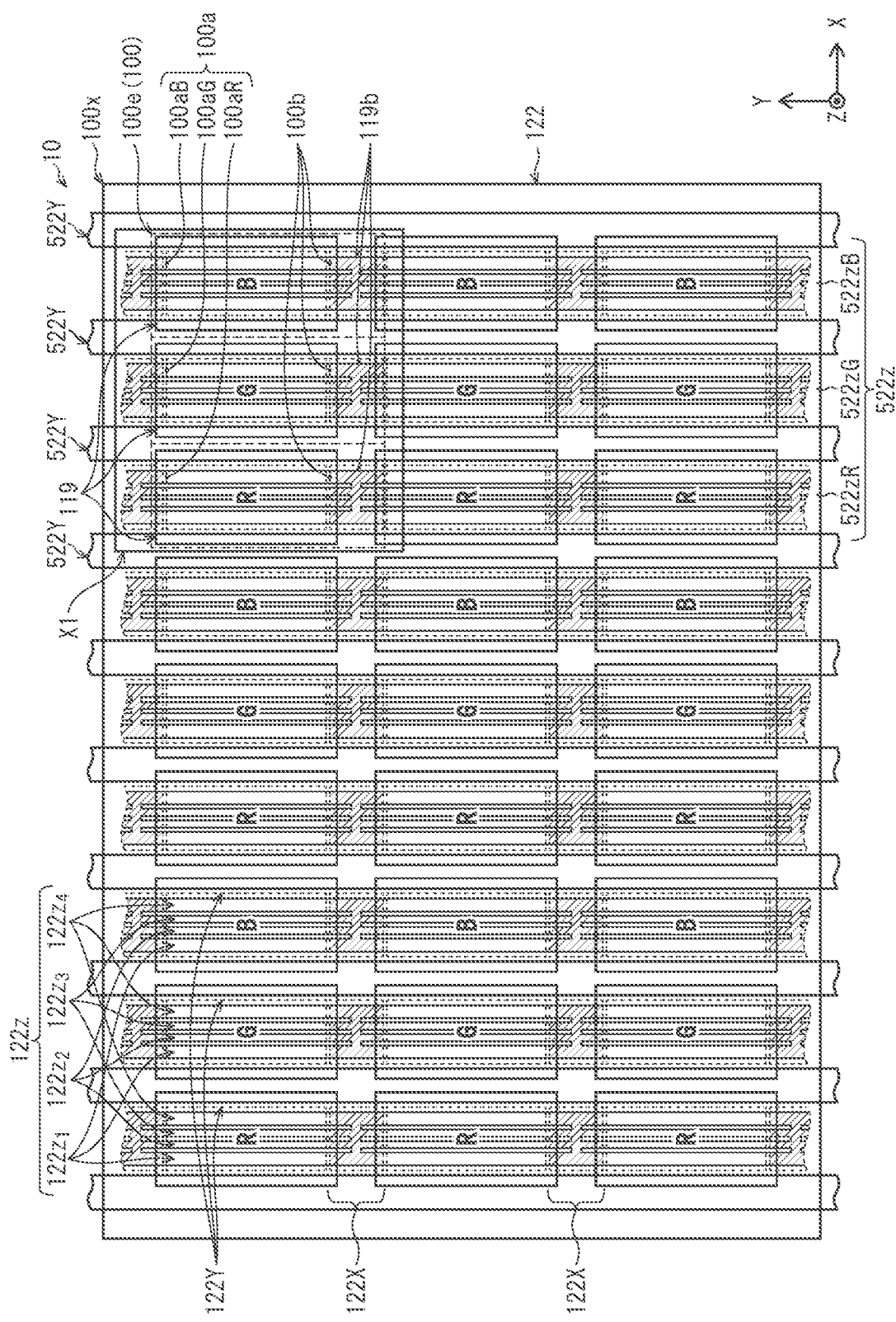
FIG. 3 is a schematic plan view illustrating a part of the organic EL display panel.

FIG. 3 is a schematic plan view illustrating a part of the display panel according to the present embodiment. FIG. 4A is an enlarged plan view of a part X in FIG. 3, illustrating one pixel 100 in the display panel 10. In addition, FIG. 4B is an enlarged plan view illustrating each subpixel 100a in the pixel 100.

The display panel 10 is an organic EL display panel utilizing an electroluminescent phenomenon of an organic compound, includes a plurality of organic EL elements 100 respectively constituting the pixel and arranged in matrix on a substrate 100x (thin film transistor (TFT) substrate) having a TFT, and has a top emission type configuration in which light is emitted from a top face. As illustrated in FIG. 3, on the display panel 10, the organic EL elements 100 constituting each pixel are arranged in matrix. In the present specification, a direction X, a direction Y, and a direction Z in FIG. 3 are defined as a row direction, a column direction, and a thickness direction respectively in the display panel 10.

As illustrated in FIG. 3, in the display panel 10, a plurality of pixel electrode layers 119 are arranged in matrix on the substrate 100x, on which insulating layers 122 are laminated so as to cover the pixel electrode layers 119.

When the upper limit of the film thickness of the insulating layer 122 is 10 μm or less, the shape can be controlled during production from the viewpoint of controlling the film thickness ununiformity and the bottom line width, and when the upper limit is 7 μm or less, increase in the cycle time due to increase in the exposure value and exposure time can be reduced, and decrease in productivity can be reduced during mass production. In addition, as the film thickness becomes thinner, the bottom line width should be narrowed almost equally to the film thickness, and thus the lower limit of the film thickness is determined depending on resolution limits of an exposure machine and a material. When the lower limit of film thickness of the insulating layer 122 is 1 μm or more, the insulating layer 122 can be produced by means of a stepper for semiconductors, and when the lower limit is 2 μm or more, the insulating layer 122 can be produced by means of a stepper for flat panels and a scanner. Thus, the thickness of the insulating layer 122 is, for example, preferably 1 to 10 μm, and more preferably 2 to 7 μm. In the present embodiment, the thickness of the insulating layer 122 is set to approximately 4.0 μm at crosspieces 122w1, 122w2, and 122w3 described hereinafter, and set to approximately 5.0 μm at other regions. The pixel electrode layer 119 has a rectangular shape in a plan view, and is made of a light reflecting material. The pixel electrode layers 119 arranged in matrix correspond to three subpixels 100aR, 100aG, and 100aB (referred to as "100a" when R, G, and B are not discriminated) sequentially arranged in the row direction.

Figure 7:
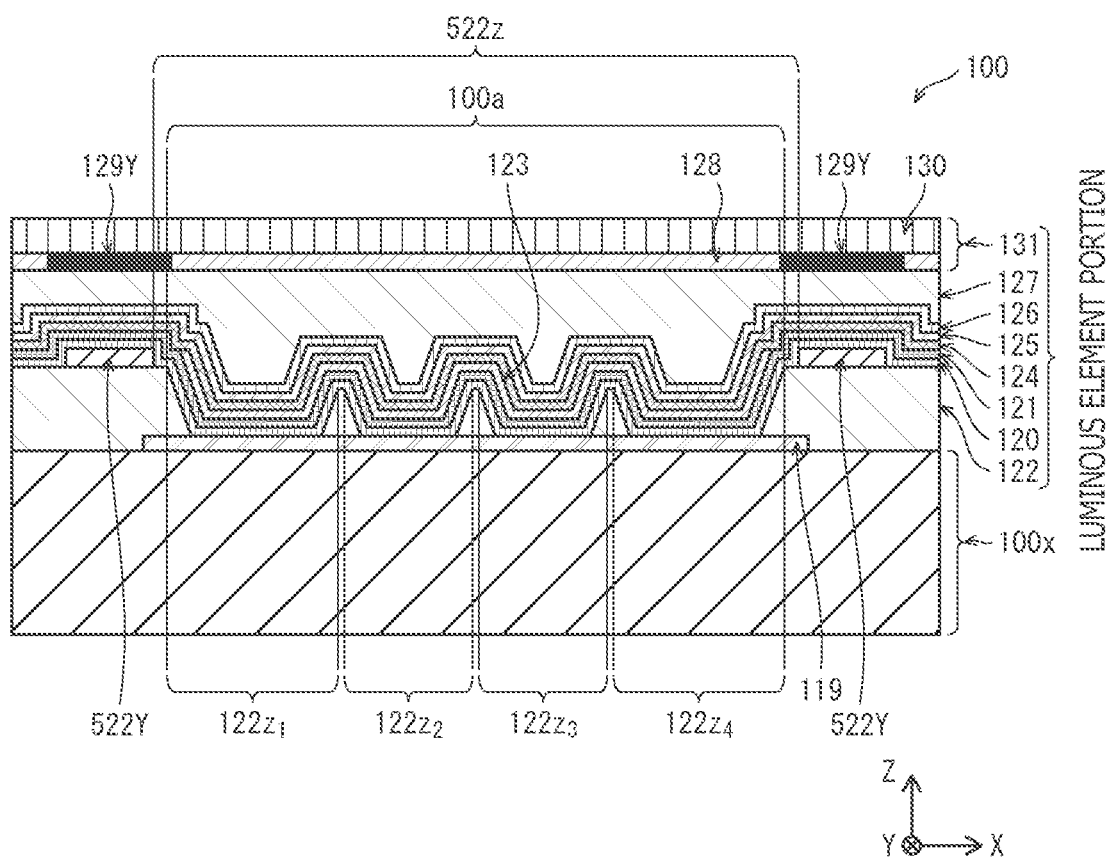
FIG. 7 is a schematic sectional view taken along B-B in FIG. 4B.

The insulating layers 122 having four slit-shaped openings 122z1 to 122z4 formed on respective pixel electrode layers 119 are laminated on the pixel electrode layers 119 arranged in matrix. As illustrated in FIG. 7, a cross section of each opening taken along the minor axis direction has a trapezoidal shape widened toward the upper surface side of the insulating layer 122. It is preferable that a depth D, a top side length Wh, and a bottom side length Wl of the cross section of each opening satisfy the following relationships.

$$0.5 \leq Wl/Wh \leq 0.8$$

$$0.5 \leq D/W \leq 2.0$$

In addition, an inclination R of the wall face is defined by $(Wh-Wl)/2D$.

Rectangular regions surrounded by the outer edges in the row and column directions of the openings 122z1 to 122z4 are luminous regions 100a which are regions emitting light by organic compounds. Herein, among the gaps on the luminous regions 100a in the insulating layers 122, the column-direction gaps between the luminous regions 100a juxtaposed in the column direction are defined as insulating layers 122Y, and row-direction gaps between the luminous regions 100a juxtaposed in the row direction are defined as insulating layers 122X. Thus, the column-direction outer edges of the luminous regions 100a are demarcated by the column-direction outer edges of the insulating layers 122X, and the row-direction outer edges of the luminous regions 100a are demarcated by the row-direction outer edges of the insulating layers 122Y.

The plurality of insulating layers 122X having each striation extending in the row direction (X direction in FIG. 3) are juxtaposed in the column direction on the column-direction outer edges of two pixel electrode layers 119 adjacent to each other in the column direction and regions adjacent to the outer edges. The regions having the insulating layers 122X are non-luminous regions 100b. As illustrated in FIG. 3, in the display panel 10, the plurality of luminous regions 100a and the plurality of non-luminous regions 100b are alternately arranged in the column direction. Contact regions 119b (contact windows) on the pixel electrode layers 119, which is electrically connected to the pixel electrode layers 119 through connection electrode layers 117 are disposed on the non-luminous regions 100b.

For the display panel 10, a line-shaped bank is adopted. On the insulating layers 122Y, a plurality of banks 522Y having each striation extending in the column direction (Y direction in FIG. 3) are juxtaposed in the row direction above the row-direction outer edges of two pixel electrode layers 119 adjacent to each other in the row direction, and regions adjacent to the outer edges.

When gaps between the column-direction banks 522Y adjacent to each other are defined as gaps 522z, the display panel 10 has a configuration in which a large number of column-direction banks 522Y and the gaps 522z are alternately arranged.

The display panel 10 has three types of luminous regions 100a: 100aR emitting a red light, 100aG emitting a green light, and 100aB emitting a blue light (hereinafter, abbreviated as "100a" when the 100aR, 100aG, and 100aB are not discriminated). Correspondingly, the gaps 522z includes a red gap 522zR corresponding to the luminous region 100aR, a green gap 522zG corresponding to the luminous region 100aG, a blue gap 522zB corresponding to the luminous region 100aB (hereinafter, referred to as "gap 522z" when the gap 522zR, 522zG, and 522zB are not discriminated). The luminous regions 100aR, 100aG, and 100aB respectively corresponding to the three subpixels 100se arranged in the row direction are integrated into one set to constitute one unit pixel 100e in a color display.

On the pixel electrode layers 119, a plurality of column-direction light shielding layers 129Y overlapping with the column-direction outer edge portions on the pixel electrode layers 119, and row-direction light shielding layers 129X overlapping with the column-direction outer edge portions on the pixel electrode layers 119 and not overlapping with a partial region in the contact regions 119b are disposed.

4. Configuration of Each Portion in Display Panel 10

Figure 5:
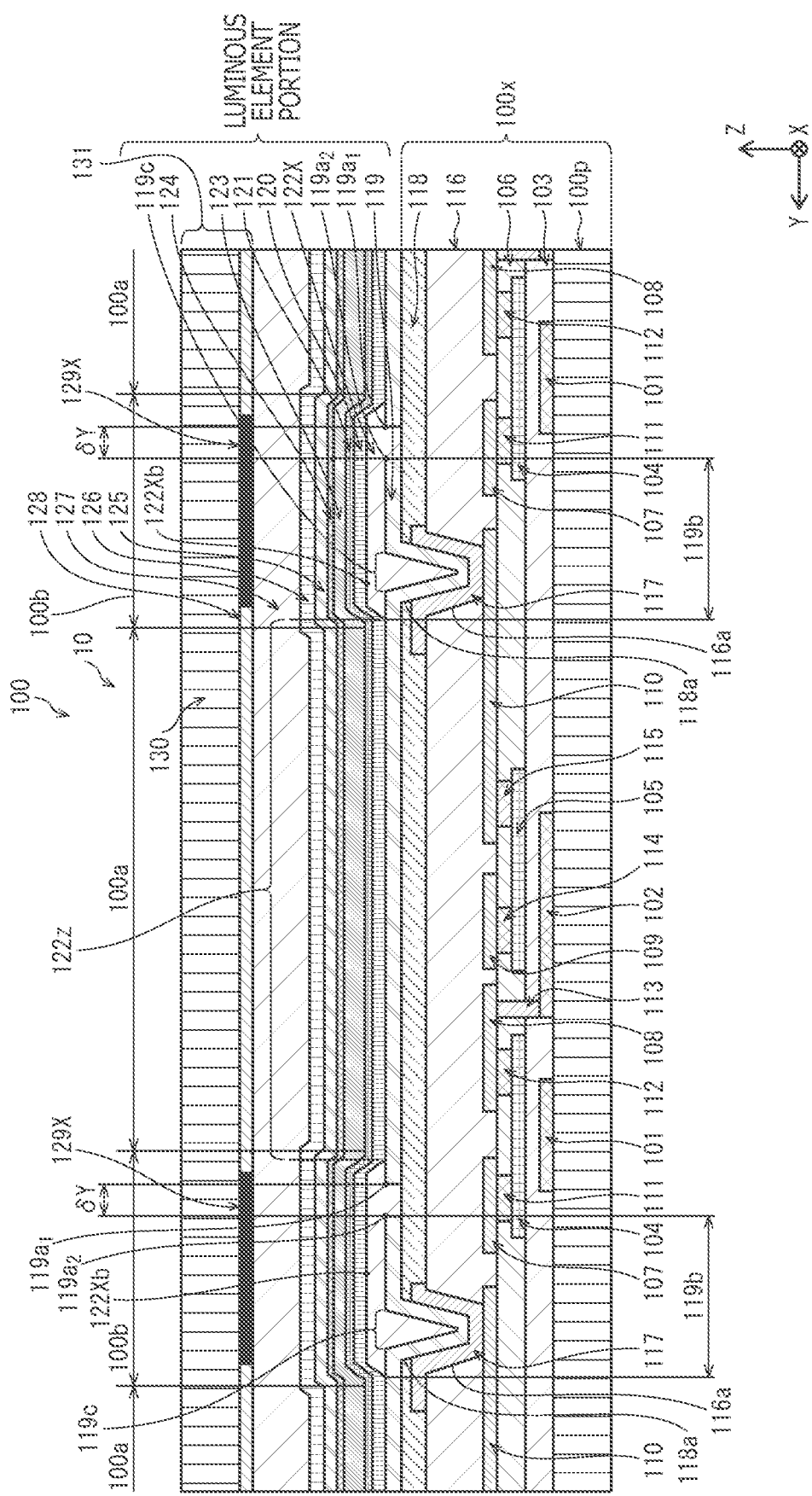
FIG. 5 is a schematic sectional view taken along A1-A1 in FIG. 4B.
Figure 6:
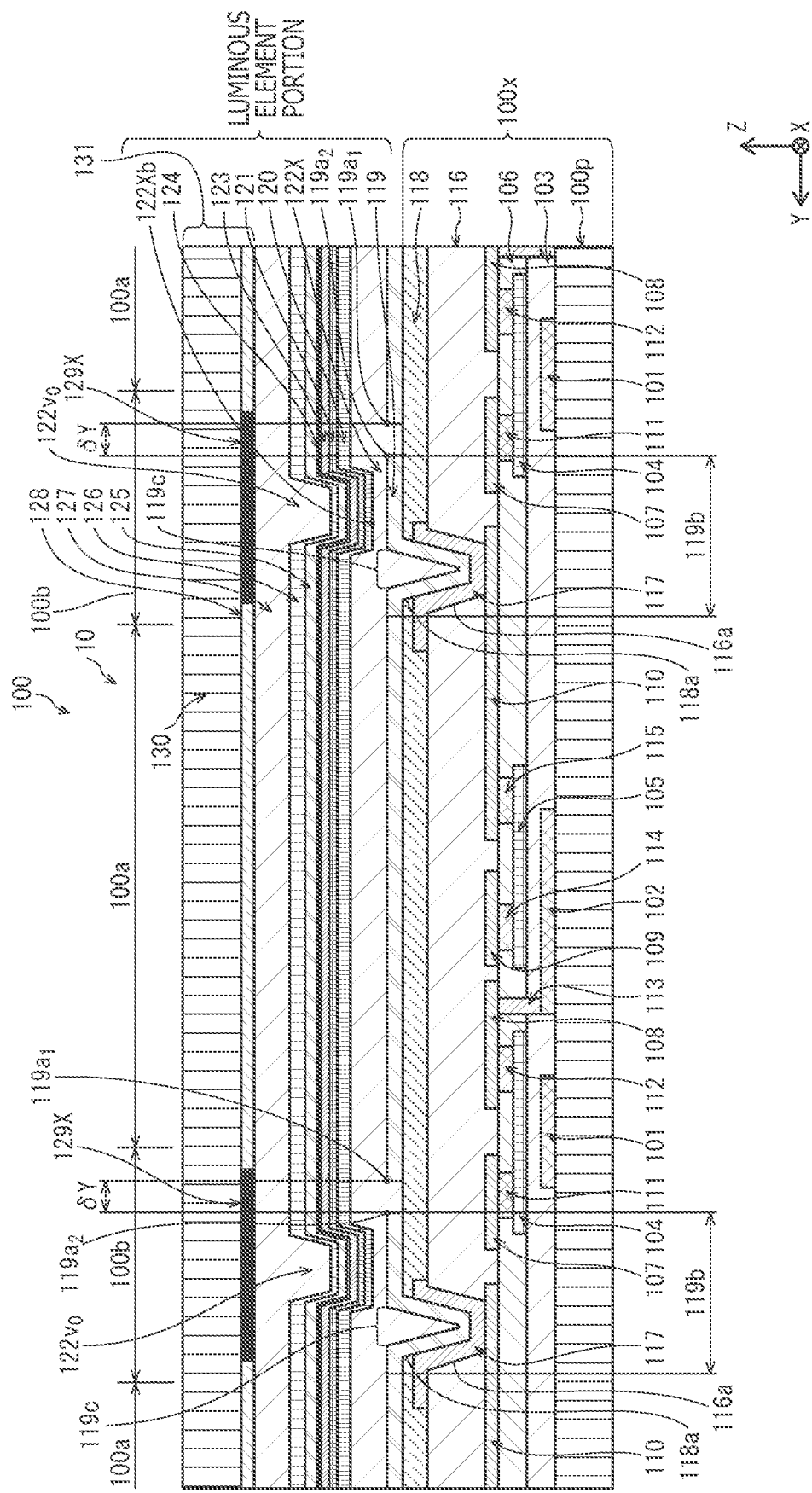
FIG. 6 is a schematic sectional view taken along A2-A2 in FIG. 4B.

The configuration of the organic EL element 100 in the display panel 10 will be explained with reference to schematic sectional views of FIG. 5 to FIG. 7. FIG. 5, FIG. 6, and FIG. 7 are schematic sectional views taken along A1-A1, A2-A2, and B-B respectively in FIG. 4B.

The display panel 10 according to the present embodiment is a top emission type organic EL display panel, wherein the substrate 100x (TFT substrate) having a thin film transistor is configured on a lower part in the Z axis direction, on which the organic EL element portion is configured.

4.1 Substrate 100x (TFT Substrate)

As illustrated in FIG. 5, gate electrodes 101 and 102 are formed with a space therebetween on a bottom substrate 100p, and a gate insulating layer 103 is formed so as to cover the surfaces of the gate electrodes 101 and 102 and the substrate 100x. On the gate insulating layer 103, channel layers 104 and 105 are formed corresponding to the gate electrodes 101 and 102 respectively. Then, a channel protective layer 106 is formed so as to cover the surfaces of the channel layers 104 and 105 and the gate insulating layer 103.

On the channel protective layer 106, source electrodes 107 and drain electrodes 108 corresponding to the gate electrodes 101 and the channel layers 104 respectively are formed with a space therebetween. Similarly, source electrodes 110 and drain electrodes 109 corresponding to the gate electrodes 102 and the channel layers 105 respectively are formed with a space therebetween.

Source lower electrodes 111 and 115, and drain lower electrodes 112 and 114 passing through the channel protective layer 106 are disposed under source electrodes 107 and 110, and drain electrodes 108 and 109 respectively. The source lower electrodes 111 and the drain lower electrodes 112 are in contact with the channel layers 104 on the lower portion in the Z axis direction, and the drain lower electrodes 114 and the source lower electrodes 115 are in contact with the channel layers 105 on the lower portion in the Z axis direction.

In addition, the drain electrodes 108 and the gate electrodes 102 are connected via contact plugs 113 disposed so as to pass through the gate insulating layer 103 and the channel protective layer 106.

Note that the gate electrode 101 corresponds to the gate G2 in FIG. 2, the source electrode 107 corresponds to the source S2 in FIG. 2, and the drain electrode 108 corresponds to the drain D2 in FIG. 2. Similarly, the gate electrode 102 corresponds to the gate G1 in FIG. 2, the source electrode 110 corresponds to the source S1 in FIG. 2, and the drain electrode 109 corresponds to the drain D1 in FIG. 2. Consequently, the switching transistor Tr2 is formed on the left side in the Y axis direction in FIG. 5, and the drive transistor Tr1 is formed on the right side relative to the switching transistor Tr2 in the Y axis direction.

However, the above configuration is an example. For the arrangement of each of transistors Tr1 and Tr2, any configuration such as a top gate type, a bottom gate type, a channel etching type, and an etching stop type may be used, and the arrangement is not limited to the configuration illustrated in FIG. 5.

A passivation layer 116 is formed so as to cover the source electrodes 107 and 110, the drain electrodes 108 and 109, and the channel protective layer 106. In the passivation layer 116, contact holes 116a are formed on a part of the upper portion of the source electrodes 110, and connection electrode layers 117 are laminated along the side walls of the contact holes 116a in an order of the source electrode 110, the contact hole 116a, and the connection electrode layer 117.

The connection electrode layers 117 are connected to the source electrodes 110 on the lower portion in the Z axis direction, and upper portions of the connection electrode layers 117 are laid on the top face of the passivation layer 116. An interlayer insulating layer 118 is deposited so as to cover the connection electrode layers 117 and the passivation layer 116.

4.2 Organic EL Element Portion (1) Pixel Electrode Layer 119

On the interlayer insulating layer 118, a pixel electrode layer 119 is disposed by a subpixel unit. The pixel electrode layer 119 is used for providing carriers to a luminous layer 123. For example, when the pixel electrode layer 119 functions as an anode, the pixel electrode layer 119 provides holes to the luminous layer 123. In addition, since the display panel 10 is of a top emission type, the pixel electrode layer 119 is light-reflective. The pixel electrode layer 119 is formed into a rectangular flat plate. The pixel electrode layers 119 are arranged with an interval δX in the row direction and an interval δY in the column direction at each of the gaps 522z on the substrate 100x. In addition, a connection recess 119c of the pixel electrode layer 119 is connected to the connection electrode layer 117 through a contact hole 118a formed on the connection electrode layer 117 in the interlayer insulating layer 118. Thereby, the pixel electrode layer 119 is connected to the source S1 of the TFT through the connection electrode layer 117. The connection recess 119c has a structure that a part of the pixel electrode layer 119 is recessed toward the substrate 100x.

Among column-direction outer edge portions 119a1 and 119a2 on the pixel electrode layer 119, a range from the outer edge portion 199a2 on the side having the connection recess 119c as a starting point to a region including the connection recess 119c is defined as a contact region 119b.

(2) Insulating Layer 122

An insulating layers 122 made of an insulating material are formed so as to cover at least end edges of the pixel electrode layers 119 arranged in matrix.

On each pixel electrode layer 119, the insulating layer 122 has slit-shaped openings 122z on the pixel electrode layer 119 excluding the contact regions 119b. As illustrated in FIG. 7, the insulating layer 122 is absent on the top face of the pixel electrode layer 119 in openings 122z1 to 122z4, and the pixel electrode layer 119 is exposed from these openings to contact a hole injection layer 120 described hereinafter. Thereby, in these openings, electrical charges can be supplied from the pixel electrode layer 119 to the hole injection layer 120. Thus, minimum rectangular regions including the openings 122z1 to 122z4 are luminous regions 100a which emit light by organic compounds of respective colors, and gap portions between the luminous regions 100a arranged in the column direction are non-luminous regions 100b. A portion between the openings 122z1 and 122z2 in the insulating layer 122 is defined as the crosspiece 122w1, a portion between the openings 122z2 and 122z3 is defined as the crosspiece 122w2, and a portion between the openings 122z3 and 122z4 is defined as the crosspiece 122w3. As illustrated in FIG. 7, the row-direction widths of the openings 122z1 and 122z4 are larger than the row-direction widths of the openings 122z2 and 122z3. This makes it possible to solve the ununiformity of the film thickness of the luminous layer and the like formed in the openings 122z1 to 122z4, as described hereinafter.

Furthermore, the gap portion between the luminous regions 100a extending in the column direction and juxtaposed in the row direction is defined as the insulating layer 122Y. Thus, the insulating layer 122Y demarcates the outer edge of the luminous region 100a of each subpixel 100se in the row direction. The cross sections of the insulating layer 122Y, the crosspieces 122w1, 122w2, and 122w3 taken along the direction parallel to the row direction are trapezoidal shapes with widths contracting upward. Thereby, light from the luminous layer 123 can be efficiently emitted upward. In addition, the heights of the crosspieces 122z1, 122z2, and 122z3 from the pixel electrode layer 119 are lower than the height of the insulating layer 122Y from the pixel electrode layer 119. Thereby, the area of the pixel electrode layer 119 covered with the bottom faces of the crosspieces 122w1, 122w2, and 122w3 can be reduced to increase the areas of the openings 122z1 to 122z4, improving the aperture ratio.

Furthermore, the gap portion between the luminous regions 100a extending in the row direction and juxtaposed in the column direction in the insulating layer 122 is defined as the insulating layer 122X (corresponding to the non-luminous region 100b). As illustrated in FIG. 4A, the insulating layer 122X is disposed on the contact region 119b in the pixel electrode layer 119, the column-direction outer edge portion 119a1 of the pixel electrode layer 119, and a column-direction outer edge portion 119a2 of the pixel electrode layer 119 adjacent to the 119a1 in the column direction. The insulating layer 122X covers the outer edge portions 119a1 and 119a2 of the pixel electrode layer 119 to prevent electrical leakage from the counter electrode layer 125, and at the same time, demarcates the outer edges of the luminous region 100a of each subpixel 100se in the column direction.

As illustrated in FIG. 3, the insulating layer 122X has grooves which communicate the openings 122z1 to 122z4 of two subpixels adjacent to each other in the column direction, and reduce ununiformity of the ink application quantity.

(3) Column-Direction Bank 522Y

The column-direction banks 522Y extend in the column direction on the insulating layer 122Y and are juxtaposed in the row direction. The column-direction bank 522Y demarcates the row-direction outer edges of the luminous layer 123 formed by damming the flow of the ink containing the organic compounds as the materials for the luminous layer 123 in the row direction. The column-direction bank 522Y is placed on outer edge portions 119a3 and 199a4 in the row direction of the pixel electrode layer 119, and is formed overlapping with a part of the pixel electrode layer 119. The column-direction bank 522Y has a line shape extending in the row direction, and its cross section taken along a direction parallel to the column direction is a forward tapered trapezoidal shape of which the upper side is tapered. The column-direction bank 522Y is disposed along the row direction perpendicular to the insulating layer 122X, and the column-direction bank 522Y has a top face at a level higher than the top face of the insulating layer 122X.

(4) Hole Injection Layer 120 and Hole Transport Layer 121

The hole injection layer 120 and the hole transport layer 121 are sequentially laminated on the insulating layer 122, the column-direction bank 522Y, and the pixel electrode layer 119 in the opening 122z. The hole transport layer 121 is in contact with the hole injection layer 120. The hole injection layer 120 and the hole transport layer 121 have a function of transporting holes injected from the pixel electrode layer 119 to the luminous layer 123.

(5) Luminous Layer 123

The display panel 10 has a configuration in which a large number of column-direction banks 522Y and the gaps 522z between the column-direction banks 522Y are alternately arranged. In the gap 522z demarcated by the column-direction bank 522Y, the luminous layer 123 is formed extending in the column direction on the top face of the hole transport layer 121. On the red gap 522zR corresponding to the luminous region 100aR, the green gap 522zG corresponding to the luminous region 100aG, and the blue gap 522zB corresponding to the luminous region 100aB, the luminous layers 123 emitting lights of respective colors are formed.

The luminous layer 123 is made of organic compounds and has a function of emitting light by recoupling holes with electrons inside. In the gap 522z, the luminous layer 123 is linearly formed so as to extend in the column direction.

Since only a part to which carriers are supplied from the pixel electrode layer 119 emits a light, the luminous layer 123 does not cause the electroluminescent phenomenon of the organic compounds in the range where the insulating layer 122 as an insulating material is interposed between the layers. Hence, in the luminous layer 123, only a part located in the opening 122z without the insulating layer 122 emits a light, and the minimum rectangular region including the openings 122z1, 122z2, 122z3, and 122z4 is the luminous region 100a.

In the luminous layer 123, a part located on the insulating layer 122X does not emit a light, and this part is the non-luminous region 100b. That is, the non-luminous region 100b refers to a region where the insulating layer 122X is projected in the plan view direction.

(6) Electron Transport Layer 124

On the column-direction bank 522Y, and in the gap 522z demarcated by the column-direction bank 522Y, the electron transport layer 124 is formed on the luminous layer 123. Also, in this case, the electron transport layer 124 is disposed on each column-direction bank 522Y exposed from the luminous layer 123. The electron transport layer 124 has a function of transporting electrons injected from the counter electrode layer 125 to the luminous layer 123.

(7) Counter Electrode Layer 125

The counter electrode layer 125 is laminated so as to cover the electron transport layer 124. The counter electrode layer 125 is continuously formed over the entire display panel 10, and may be connected to a bus-bar wiring by a unit of a pixel or several pixels (illustration is omitted). The counter electrode layer 125 forms an energization path by pairing with the pixel electrode layer 119 to sandwich the luminous layer 123, so that carriers are supplied to the luminous layer 123. For example, when the counter electrode layer 125 functions as a cathode, electrons are supplied to the luminous layer 123. The counter electrode layer 125 is formed along the surface of the electron transport layer 124, and used as an electrode common to each luminous layer 123.

For the counter electrode layer 125, a light transmissive conductive material is used because the display panel 10 is of a top emission type. For example, indium tin oxide (ITO), indium zinc oxide (IZO), or the like can be used. In addition, an electrode prepared by thinning silver (Ag) or aluminum (Al), or the like may be used.

(8) Sealing Layer 126

A sealing layer 126 is laminated so as to cover the counter electrode layer 125. The sealing layer 126 is used for preventing the luminous layer 123 from deteriorating due to contact with moisture, air, or the like. The sealing layer 126 is disposed over the entire surface of the display panel 10 so as to cover the top face of the counter electrode layer 125. As a material of the sealing layer 126, for example, a light transmissive material such as silicon nitride and silicon oxynitride is used because the display panel 10 is of a top emission type.

(9) Bonding Layer 127

Above the sealing layer 126 in the Z axis direction, a CF substrate 131 having a color filter layer 128 and a light shielding layer 129 formed on the lower main face of a top substrate 130 in the Z axis direction is disposed, and is bonded through a bonding layer 127. The bonding layer 127 bonds the back panel composed of respective layers from the substrate 100x to the sealing layer 126 with the CF substrate 131, and further has a function of preventing each layer from being exposed to moisture or air.

Additionally, in the display panel 10, it is preferable that when a refractive index of the bonding layer 127 is defined as n1, and a refractive index of the insulating layer 122 is defined as n2, expressions $1.1 \leq n \leq 1.8$ and $|n1-n2| \geq 0.20$ are satisfied, and when an inclination of the reflector slope is defined as θ, expressions $n2 < n1$ and $75.2-54(n1-n2) \leq \theta \leq 81.0-20(n1-n2)$ are satisfied.

(10) Top Substrate 130

The CF substrate 131 in which the color filter layer 128 and the light shielding layer 129 are formed on the top substrate 130 is disposed and bonded onto the bonding layer 127. The top substrate 130 is made of, for example, a light transmissive material such as a cover glass and a transparent resin film because the display panel 10 is of a top emission type. In addition, the top substrate 130 can improve the rigidity of the display panel 10 and prevent intrusion of moisture, air, and the like.

(11) Color Filter Layer 128

On the top substrate 130, the color filter layer 128 is formed at a position corresponding to each color luminous region 100a of the pixel. The color filter layer 128 is a transparent layer provided for transmitting visible lights having wavelengths corresponding to R, G, and B, and has a function of transmitting the light emitted from each color pixel to correct the chromaticity of the color. For example, in this case, red, green, and blue filter layers 128R, 128G, and 128B are formed above the luminous region 100aR in the red gap 522zR, the luminous region 100aG in the green gap 522zG, and the luminous region 100aB in the blue gap 522zB respectively. Specifically, the color filter layer 128 is formed, for example, by a process in which an ink containing a color filter material and a solvent is applied on the top substrate 130 composed of a cover glass for forming a color filter having a plurality of openings formed in matrix by a pixel unit.

(12) Light Shielding Layer 129

On the top substrate 130, the light shielding layer 129 is formed at a position corresponding to a boundary between the luminous regions 100a of the respective pixels.

The light shielding layer 129 is a black resin layer disposed so as not to transmit visible lights having wavelengths corresponding to R, G, and B, and is made of, for example, a resin material containing a black pigment excellent in light absorbency and light shielding property. The light shielding layer 129 is formed for the purposes of preventing external light from entering the inside of the display panel 10, preventing internal components from being seen through the top substrate 130, improving the contrast of the display panel 10 by suppressing reflection of external light, and the like. The reflection of external light refers to a phenomenon in which external light entering the display panel 10 from above the top substrate 130 is reflected by the pixel electrode layer 119, and thereby re-emitted from the top substrate 130.

In addition, the light shielding layer 129 has functions of blocking light leaking out to the adjacent pixels among lights emitted from respective color pixels, preventing pixel boundaries from becoming unclear, and improving a color purity of the light emitted from the pixel.

The light shielding layer 129 has the plurality of column-direction light shielding layers 129Y extending in the column direction and juxtaposed in the row direction and a plurality of row-direction light shielding layers 129X extending in the row direction and juxtaposed in the column direction, and the column-direction light shielding layers 129Y and the row-direction light shielding layers 129X are arranged in a grid shape. In the organic EL element 100, the column-direction light shielding layer 129Y is disposed at a position overlapping with the insulating layer 122Y as illustrated in FIG. 7, and the row-direction light shielding layer 129X is disposed at a position overlapping with the insulating layer 122X as illustrated in FIG. 5 and FIG. 6.

4.3 Constituent Materials of Each Portion

An example of the constituent materials of each portion illustrated in FIG. 5, FIG. 6, and FIG. 7 will be described.

(1) Substrate 100x (TFT Substrate)

For a substrate 100x0, a known material for the TFT substrate can be used.

As the bottom substrate 100p, for example, a glass substrate, a quartz substrate, a silicon substrate, a metal substrate such as molybdenum sulfide, copper, zinc, aluminum, stainless steel, magnesium, iron, nickel, gold, and silver, a semiconductor substrate such as a gallium arsenide substrate, a plastic substrate, and the like can be adopted.

As a plastic material, any of thermoplastic resins and thermosetting resins may be used. Examples of the plastic material include polyethylene, polypropylene, polyamide, polyimide (PI) polycarbonate, acrylic resin, polyethylene terephthalate (PET), polybutylene terephthalate, polyacetal, other fluorine-based resins, various thermoplastic elastomers based on styrene, polyolefin, polyvinyl chloride, polyurethane, fluororubber, chlorinated polyethylene, and the like, an epoxy resin, an unsaturated polyester, a silicone resin, polyurethane, and the like, or copolymers, blends, and polymer alloys mainly composed thereof, and the like. Among them, a laminate on which one or plural materials are laminated can be used.

For the gate electrodes 101 and 102, for example, a laminate composed of copper (Cu) and molybdenum (Mo) is adopted. However, another metal material can also be adopted.

For the gate insulating layer 103, any of known organic materials and inorganic materials such as silicon oxide (SiO2) and silicon nitride (SiNx) can be used as long as the material has an electrical insulating property.

For the channel layers 104 and 105, an oxide semiconductor containing at least one selected from indium (In), gallium (Ga), and zinc (Zn) can be adopted.

For the channel protective layer 106, for example, silicon oxynitride (SiON), silicon nitride (SiN), or aluminum oxide (AlOx) can be used.

For the source electrodes 107 and 110 and the drain electrodes 108 and 109, for example, a laminate composed of copper manganese (CuMn), copper (Cu), and molybdenum (Mo) can be adopted.

Also, the source lower electrodes 111 and 115 and the drain lower electrodes 112 and 114 can be composed of the same materials.

For the passivation layer 116, for example, silicon oxide (SiO2), silicon nitride (SiN), silicon oxynitride (SiON), a laminate composed thereof, or the like can also be used.

For the connection electrode layer 117, for example, a laminate composed of molybdenum (Mo), copper (Cu) and copper manganese (CuMn) can be adopted. However, any material can be appropriately selected from conductive materials.

The interlayer insulating layer 118 is made of, for example, organic compounds such as polyimide, polyamide, or an acrylic resin material, and can have a thickness in a range of 2000 to 8000 [nm].

(2) Pixel Electrode Layer 119

The pixel electrode layer 119 is made of a metal material. In the case of the top emission type display panel 10 according to the present embodiment, the surface portion of the pixel electrode layer 119 has preferably high reflectivity. In the display panel 10 according to the present embodiment, the pixel electrode layer 119 may have a structure in which a plurality of films selected from a metal layer, an alloy layer, and a transparent conductive film are laminated. The metal layer can be composed of a metal material containing, for example, silver (Ag) or aluminum (Al). For the alloy layer, for example, APC (alloy of silver, palladium, and copper), ARA (alloy of silver, rubidium, and gold), MoCr (alloy of molybdenum and chromium), NiCr (alloy of nickel and chromium), or the like can be used. As the constituent materials for the transparent conductive layer, for example, indium tin oxide (ITO), indium zinc oxide (IZO), or the like can be used.

(3) Insulating Layer 122

The insulating layer 122 is composed of an insulating material, and is made of, for example, an inorganic material such as silicon nitride (SiN), silicon oxynitride (SiON).

(4) Column-Direction Bank 522Y

The column-direction bank 522Y is made of an organic material such as a resin, and has an electrical insulating property. Examples of the organic materials used for forming the column-direction bank 522Y include an acrylic resin, a polyimide-based resin, a novolac type phenol resin, and the like. The column-direction bank 522Y is preferably resistant to organic solvents. Furthermore, since the column-direction bank 522Y is subjected to an etching treatment, a baking treatment, or the like during the manufacturing process in some cases, the column-direction bank 522Y is preferably made of a highly resistant material which is not excessively deformed or denatured by such a treatment. For the purpose of providing water repellency to the surface, the surface may be treated with fluorine. In addition, a material containing fluorine may be used for forming the column-direction bank 522Y.

(5) Hole Injection Layer 120

The hole injection layer 120 is made of an oxide of silver (Ag), molybdenum (Mo), chromium (Cr), vanadium (V), tungsten (W), nickel (Ni), iridium (Ir) or the like, or a conductive polymer material such as PEDOT (mixture of polythiophene and polystyrenesulfonic acid).

When the hole injection layer 120 is composed of an oxide of a transition metal, the transition metal has a plurality of oxidation numbers, thus a plurality of oxidation levels can be taken, and as a result, hole injection can be facilitated and the drive voltage can be reduced.

(6) Hole Transport Layer 121

For the hole transport layer 121, for example, a polymer compound such as polyfluorene or a derivative thereof, and polyarylamine or a derivative thereof, and the like can be used.

(7) Luminous Layer 123

As described hereinbefore, the luminous layer 123 functionally emits light when holes and electrons are injected to the luminous layer 123 and recouple with each other to generate an excited state. As a material used for forming the luminous layer 123, it is necessary to use a luminous organic material which can be formed into a film by a wet printing method.

Specifically, the luminous layer 123 is preferably made of, for example, a fluorescent substance such as an oxynoid compound, a perylene compound, a coumarin compound, an azacoumarin compound, an oxazole compound, an oxadiazole compound, a perinone compound, a pyrrolopyrrole compound, a naphthalene compound, an anthracene compound, a fluorene compound, a fluoranthene compound, a tetracene compound, a pyrene compound, a coronene compound, quinolone and azaquinolone compounds, pyrazoline and pyrazolone derivatives, a rhodamine compound, a chrysene compound, a phenanthrene compound, a cyclopentadiene compound, a stilbene compound, a diphenylquinone compound, a styryl compound, a butadiene compound, a dicyanomethylenepyran compound, a dicyanomethylenethiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, an acridine compound, a metal complex of a 8-hydroxyquinoline compound, a metal complex of a 2-bipyridine compound, a complex of a Schiff base and a group III metal, an oxine metal complex, and a rare earth complex.

(8) Electron Transport Layer 124

The electron transport layer 124 is made of, for example, an oxadiazole derivative (OXD), a triazole derivative (TAZ), a phenanthroline derivative (BCP, Bphen), or the like. In addition, for the purpose of improving the electron injection performance, a metal material may be doped by co-depositing an alkali metal or an alkaline earth metal to these organic materials. Furthermore, an alkali metal fluoride such as sodium fluoride (NaF) may be used, or a laminate structure of an alkali metal fluoride and an organic layer may be used.

(9) Counter Electrode Layer 125

The counter electrode layer 125 is made of, for example, indium tin oxide (ITO), indium zinc oxide (IZO), or the like. In addition, an electrode prepared by thinning silver (Ag), aluminum (Al), or the like may be used.

(10) Sealing Layer 126

The sealing layer 126 has a function of preventing the organic layer such as the luminous layer 123 from being exposed to moisture and air, and is made of, for example, a light transmissive material such as silicon nitride (SiN) and silicon oxynitride (SiON). Additionally, a sealing resin layer made of a resin material such as an acrylic resin or a silicone resin may be disposed on a layer made of a material such as silicon nitride (SiN) and silicon oxynitride (SiON).

In the case of the top emission type display panel 10 according to the present embodiment, the sealing layer 126 should be made of a light transmissive material.

(11) Bonding Layer 127

The bonding layer 127 is made of, for example, a resin adhesive or the like. For the bonding layer 127, a light transmissive resin material such as an acrylic resin, a silicone resin, and an epoxy resin can be adopted.

(12) Top Substrate 130

For the top substrate 130, for example, a light transmissive material such as a glass substrate, a quartz substrate, and a plastic substrate can be adopted.

(13) Color Filter Layer 128

For the color filter layer 128, a known resin material (e.g. a color resist as a commercially available product, manufactured by JSR Corporation) and the like can be adopted.

(14) Light Shielding layer 129

The light shielding layer 129 is made of a resin material mainly composed of an ultraviolet curing resin (e.g. ultraviolet curing acrylic resin) material and prepared by adding a black pigment to the ultraviolet curing resin material. As the black pigment, for example, a light shielding material such as a carbon black pigment, a titanium black pigment, a metal oxide pigment, and an organic pigment can be adopted.

4.4 Improvement of Light Extraction Efficiency by Reflector Structure

The display panel 10 includes the insulating layer 122 having the openings 122z, a reflector (reflecting structure) composed of the bonding layer 127 of which the back face protrudes into the openings 122z of the insulating layer 122, and the luminous layer 123 interposed between the insulating layer 122 and the reflector, in which the cross sectional profile of the opening 122z taken along the row direction is a trapezoidal shape widened upward, and characterized in that when a refractive index of the bonding layer 127 is defined as n1 and a refractive index of the insulating layer 122 is defined as n2, the following expressions are satisfied.

$1.1 \leq n1 \leq 1.8$ (Expression 1)

$|n1-n2| \geq 0.20$ (Expression 2)

n2 is preferably 1.4 to 1.6.

Furthermore, it is preferable that a depth D in the cross section of the opening 122z, an opening width Wh on the top face side of the insulating layer 122, and an opening width W1 on the top face side of the insulating layer 122 satisfy the following expressions.

$0.5 \leq W1/Wh \leq 0.8$ (Expression 3)

$0.5 D/W1 \leq 2.0$ (Expression 4)

When adopting such conditions of the shape and the refractive index, the light extraction efficiency from the luminous layer 123 can be improved by the reflector structure based on the openings 122z in the insulating layer 122. As a result, according to the study of the inventors, the luminance per a subpixel can be increased by 1.2 to 1.5 times compared to the case without the reflector structure.

Figure 8A:
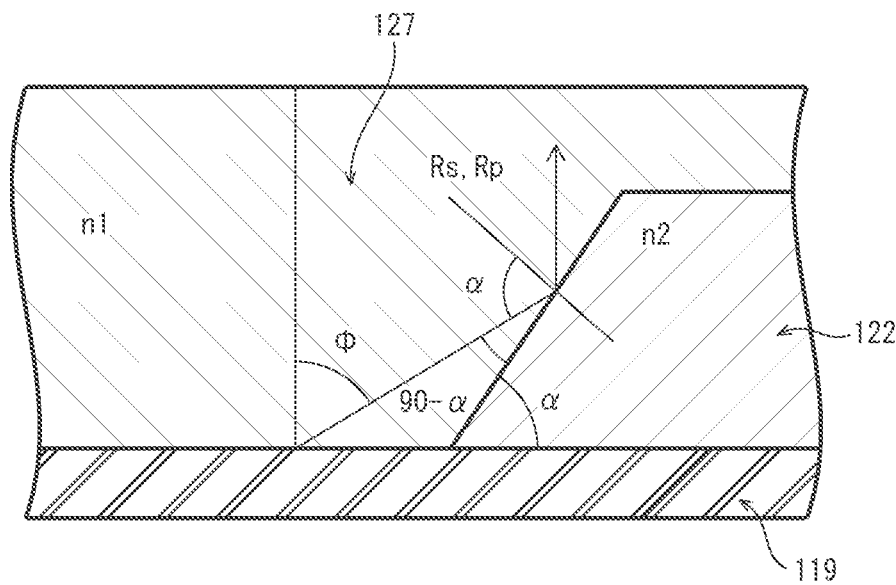
FIG. 8A is a schematic diagram illustrating a method for calculating an inclination a of a wall face of an opening for obtaining a total reflection in an organic EL element.
Figure 8B:
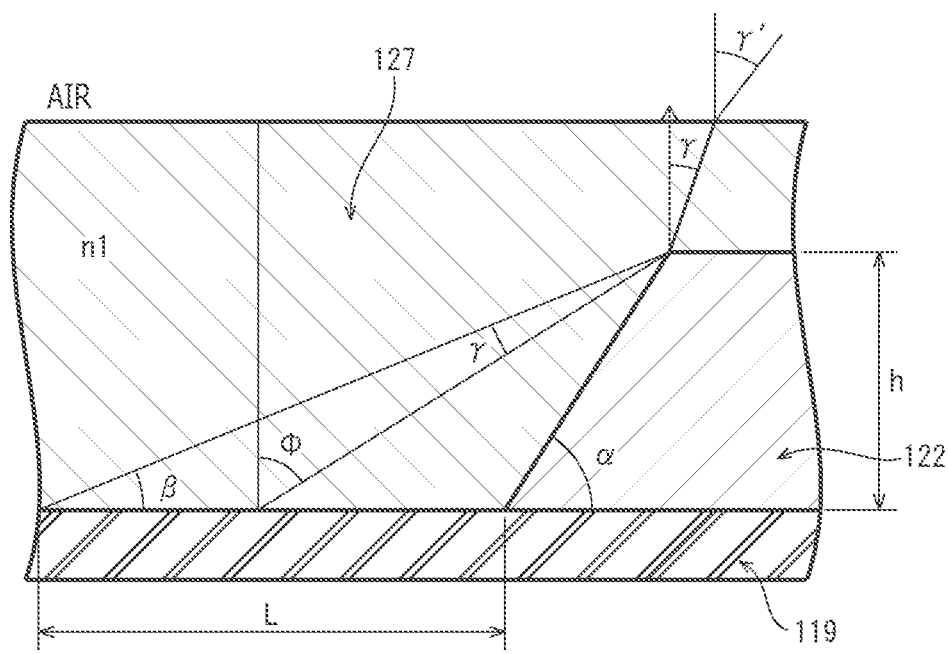
FIG. 8B is a schematic diagram illustrating a method for calculating an effective luminous range L where an emitted light is reflected by the wall face of the opening to reach an effective viewing angle γ'.

FIG. 8A is a schematic diagram illustrating a method for calculating an inclination a of the wall face of the opening 122z for obtaining a total reflection in the organic EL element 100 using the reflector structure. FIG. 8B is a schematic diagram illustrating a method for calculating an effective luminous range L where an emitted light is reflected by the wall face of the opening 122z to reach an effective viewing angle γ'.

In FIG. 8A, when an incidence angle to the wall face of the opening 122z is defined as φ, the following expressions are satisfied.

$\varphi = 2(90-\alpha) = 180-2\alpha$ (Expression 5)

$\alpha = 90 - \varphi/2$ (Expression 6)

The inclination angle αz for obtaining the total reflection is calculated by the following expression.

$\alpha z = \sin-1(n2/n1)$ (Expression 7)

In FIG. 8B, the effective luminous range L where an emitted light is reflected by the wall face of the opening 122z to reach an effective viewing angle γ' is calculated by the following expressions.

$\gamma = \sin-1(\sin \gamma'/n1)$ (Expression 8)

$\beta = 90 - \varphi - \gamma$ (Expression 9)

$L = h(1/\tan \beta - 1/\tan \alpha)$ (Expression 10)

For example, in a case of n1=1.8, α=70°, γ'=20°, and h=5 μm, values of φ=40°, γ=11°, β=39°, and L=4.4 μm are determined.

5. Manufacturing Method for Display Panel 10

A manufacturing method for the display panel 10 will be explained with reference to the drawings. FIGS. 9A, 9B, 9C, 9D, 9E, 10A, 10B, 10C, 11A, 11B and 11C are schematic sectional views taken along the same line A1-A1 in FIG. 4B, illustrating states at each step in the production of the organic EL display panel 10. FIGS. 13A, 13B, 13C, 13D, 14A, 14B, 14C and 14D are schematic sectional views taken along the same line B-B in FIG. 4B, illustrating states at each step in the manufacture of the organic EL display panel 10.

(1) Formation of Substrate 100x (TFT Substrate)

Figure 9A:
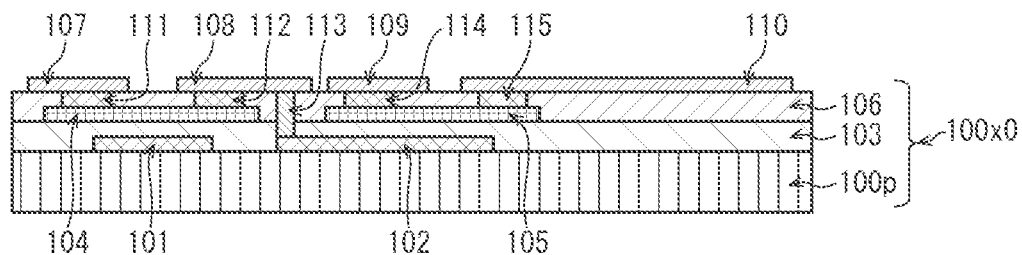
FIG. 9A is a schematic sectional view taken along the same line A1-A1 in FIG. 4B, illustrating a state at a step of forming a substrate in production of the organic EL display panel.

First, the substrate 100x0 on which only the source electrodes 107 and 110 and the drain electrodes 108 and 109 are formed, is prepared (FIG. 9A). The substrate 100x0 can be manufactured by a known TFT manufacturing method.

Figure 9B:
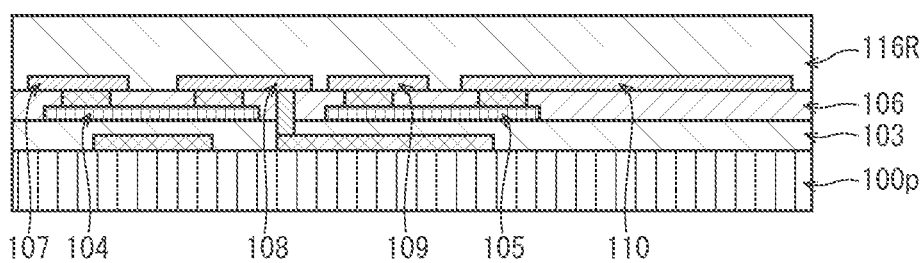
FIG. 9B is a schematic sectional view taken along the same line A1-A1 in FIG. 4B, illustrating a state at a step of forming a passivation layer in production of the organic EL display panel.

Next, the passivation layer 116 is laminated so as to cover the source electrodes 107 and 108, the drain electrodes 108 and 109, and the channel protective layer 106, for example, by a plasma CVD method or a sputtering method (FIG. 9B).

Figure 9C:
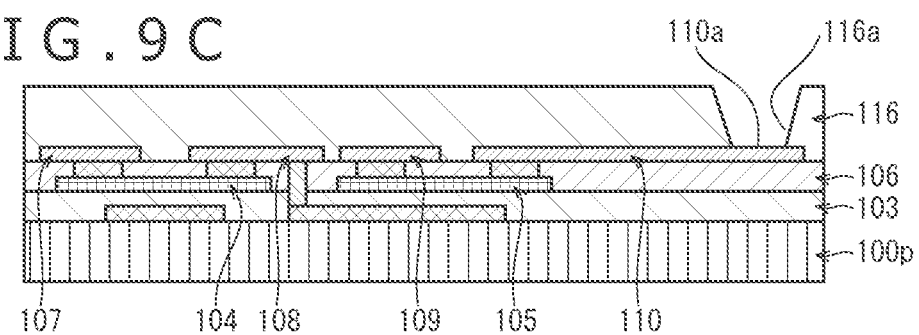
FIG. 9C is a schematic sectional view taken along the same line A1-A1 in FIG. 4B, illustrating a state at a step of forming a contact hole in production of the organic EL display panel.

Next, the contact hole 116a is formed on a part of the source electrode 110 in the passivation layer 116 by a dry etching method (FIG. 9C). The contact hole 116a is formed so that the surface 110a of the source electrode 110 is exposed on the bottom of the contact hole 116a.

Figure 9D:
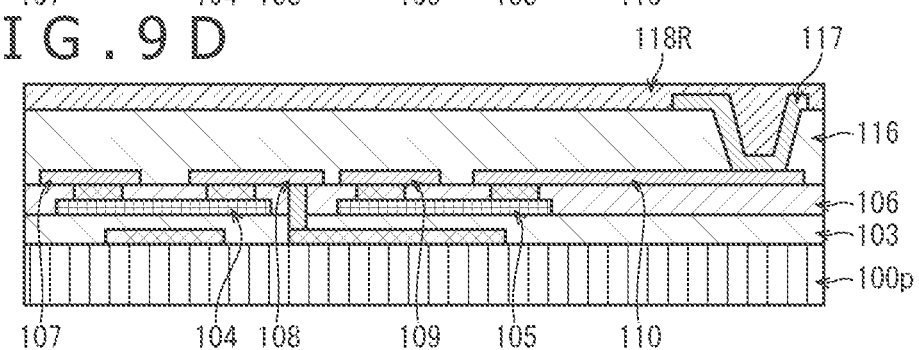
FIG. 9D is a schematic sectional view taken along the same line A1-A1 in FIG. 4B, illustrating a state at a step of forming an interlayer insulating layer in production of the organic EL display panel.

Next, the connection electrode layer 117 is formed along the inner wall of the contact hole 116a formed in the passivation layer 116. The upper parts of the connection electrode layer 117 are laid on the passivation layer 116. The connection electrode layer 117 can be formed, for example, by a sputtering method. After the metal film is formed, the connection electrode layer 117 is patterned by a photolithography method and a wet etching method. Furthermore, the interlayer insulating layer 118 is laminated by applying the above organic material so as to cover the connection electrode layer 117 and the passivation layer 116, and flattening the surface (FIG. 9D).

(2) Formation of Pixel Electrode Layer 119

Figure 9E:
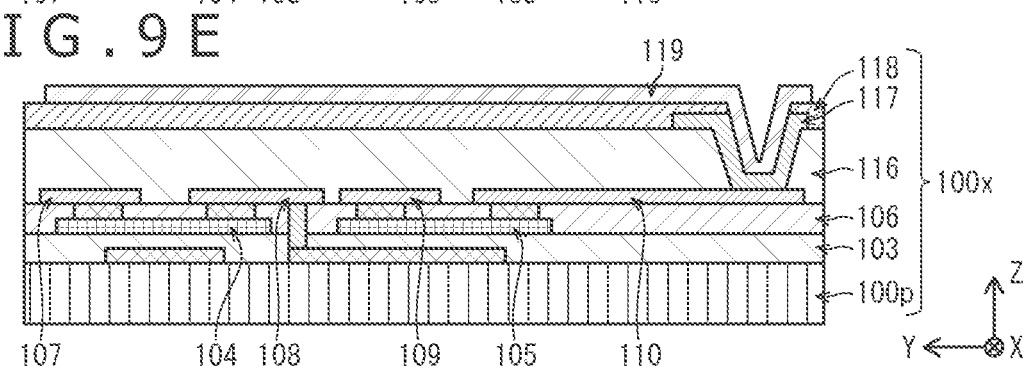
FIG. 9E is a schematic sectional view taken along the same line A1-A1 in FIG. 4B, illustrating a state at a step of forming a pixel electrode layer in production of the organic EL display panel.

The contact hole is formed on the connection electrode layer 117 in the interlayer insulating layer 118, on which the pixel electrode layer 119 is formed (FIG. 9E). The pixel electrode layer 119 is formed by forming a metal film using a sputtering method or a vacuum deposition method, or the like, and then patterning the metal film using a photolithography method and an etching method. Note that the pixel electrode layer 119 is electrically connected to the connection electrode layer 117.

(3) Formation of Insulating Layer 122

Figure 10A:
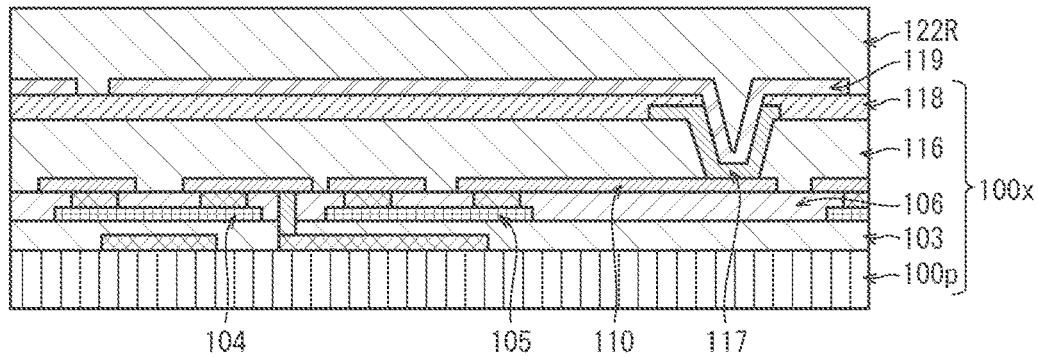
FIG. 10A is a schematic sectional view taken along the same line A1-A1 in FIG. 4B, illustrating a state at a step of forming an insulating layer in production of the organic EL display panel.
Figure 10B:
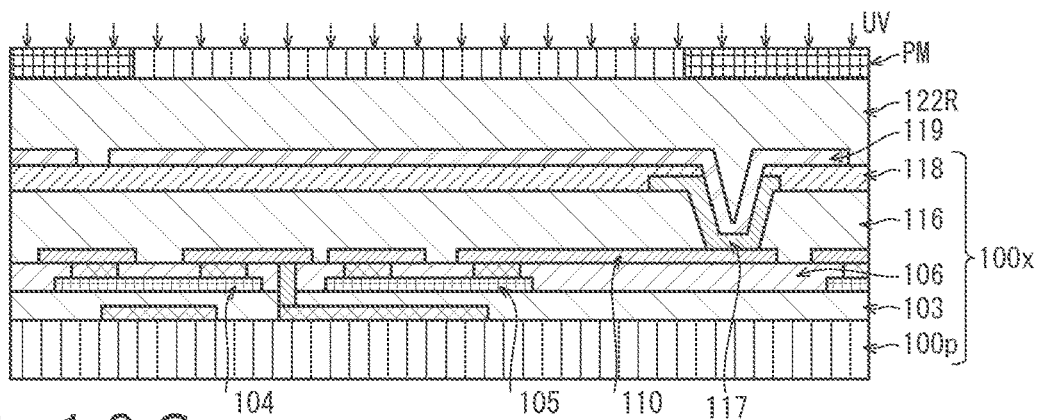
FIG. 10B is a schematic sectional view taken along the same line A1-A1 in FIG. 4B, illustrating a state at a step of forming the insulating layer in production of the organic EL display panel.
Figure 13A:
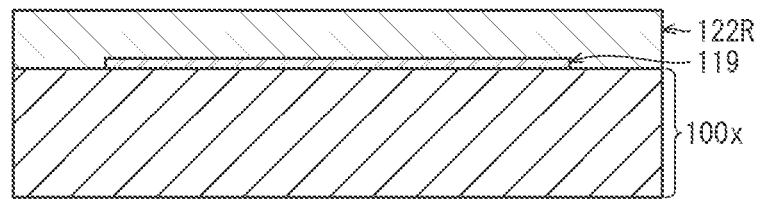
FIG. 13A is a schematic sectional view taken along the same line B-B in FIG. 4B, illustrating a state at a step of forming the insulating layer in production of the organic EL display panel.
Figure 13B:
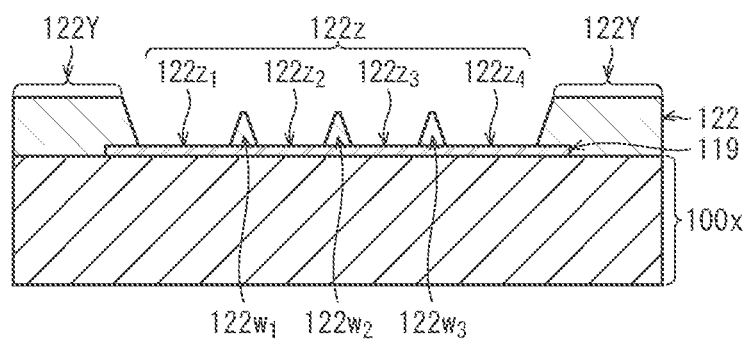
FIG. 13B is a schematic sectional view taken along the same line B-B in FIG. 4B, illustrating a state at a step of forming the insulating layer in production of the organic EL display panel.

A photoresist film 122R made of a metal oxide, a metal nitride (e.g. silicon nitride (SiN), silicon oxynitride (SiON)) is formed using a CVD method (FIG. 10A and FIG. 13A), then dried to volatilize the solvent to some extent, on which a photomask PM having predetermined openings is laminated, which is irradiated with ultraviolet rays to transfer a pattern made on the photomask PM to the photoresist made of a photosensitive resin and the like (FIG. 10B, FIG. 13B).

In the present embodiment, as the photomask PM, for example, a positive type photomask having light transmissive portions corresponding to the openings 122z1 to 122z4 (vertically striped portions in the drawing) is used. Thereby, a pattern of openings corresponding to the shape of the transmissive portions corresponding to the openings 122z is formed on the photoresist.

Figure 10C:
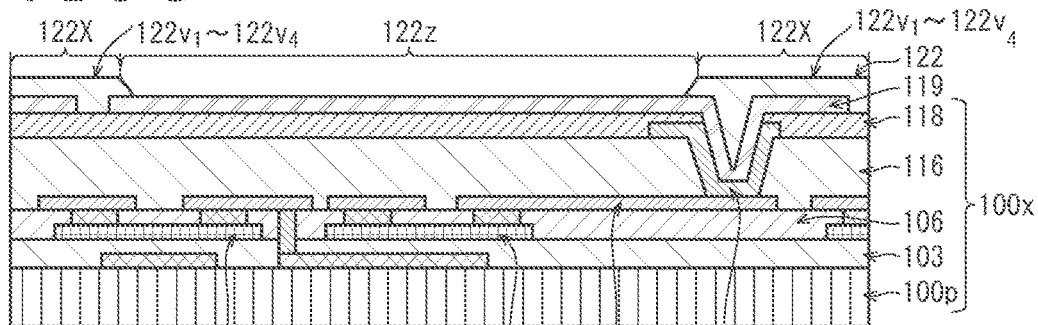
FIG. 10C is a schematic sectional view taken along the same line A1-A1 in FIG. 4B, illustrating a state at a step of forming the insulating layer in production of the organic EL display panel.
Figure 10D:
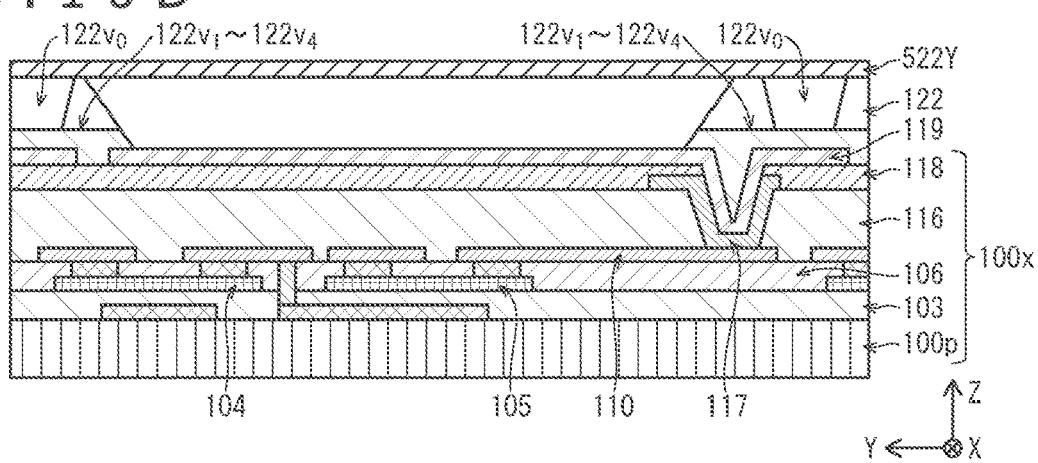
FIG. 10D is a schematic sectional view taken along the same line A1-A1 in FIG. 4B, illustrating a state at a step of forming a column-direction bank in production of the organic EL display panel.
Figure 13C:
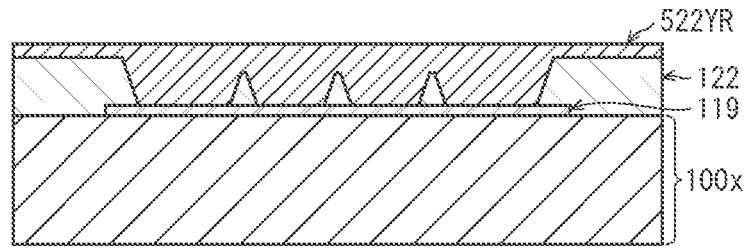
FIG. 13C is a schematic sectional view taken along the same line B-B in FIG. 4B, illustrating a state at a step of forming the insulating layer in production of the organic EL display panel.

Next, the photoresist is developed, then an insulating layer 122 on which the insulating layers 122X and 122Y and the openings 122z are patterned is formed by a reactive ion etching (RIE) method (FIG. 10C, FIG. 13C). Thereby, on the openings 122z corresponding to the transmissive portions, the insulating layer 122 is removed by etching. At this time, the cross section of the opening 122z perpendicularly cut in the longitudinal direction has a trapezoidal shape widened toward a top face 122Xb side of the insulating layer 122, as described hereinbefore. On the other hand, the insulating layer 122 remains on an unexposed part. As a result, the insulating layer 122 surrounds a region demarcating each pixel by the insulating layers 122X and 122Y, patterning is made on the bottom of the opening 122z such that the surface of the pixel electrode layer 119 is exposed. In addition, each of a distance between the opening 122z1 and the opening 122z2, a distance between the opening 122z2 and the opening 122z3, and a distance between the opening 122z3 and the opening 122z4 are shorter than a distance between the opening 122z4 and the opening 122z1 of the subpixel adjacent to the opening 122z4 in the X direction. Thus, the top faces of the crosspieces 122w1, 122w2, and 122w3 are lower than the top face of the insulating layer 122Y. Specifically, in relation to the cross-sectional shape taken along the face perpendicular to the Y direction, the cross section of the insulating layer 122Y partitioning the subpixel has a trapezoidal shape, meanwhile the cross sections of the crosspieces 122w1, 122w2, and 122w3 have a triangular shape with a Z-directional thickness smaller than that of the insulating layer 122Y.

(4) Formation of Column-direction Bank 522Y

Figure 13D:
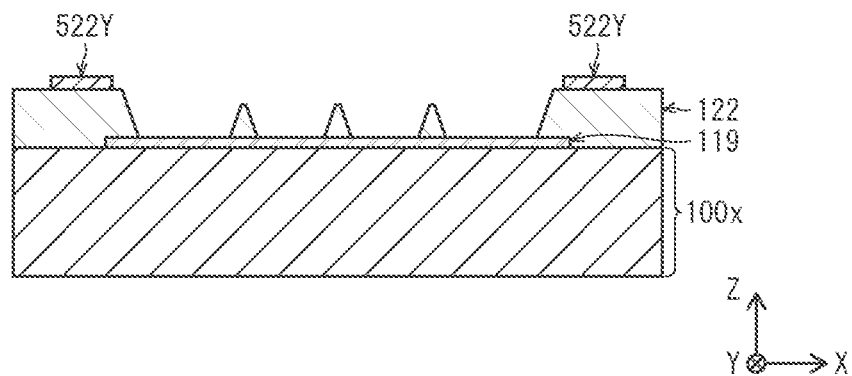
FIG. 13D is a schematic sectional view taken along the same line B-B in FIG. 4B, illustrating a state at a step of forming the insulating layer in production of the organic EL display panel.

For formation of the column-direction bank 522Y, first, for example, a film 522YR made of a constituent material (e.g. photosensitive resin material) of the column-direction bank 522Y is laminated on the insulating layer 122 by a spin coating method, or the like (FIG. 10C, FIG. 13C). Then, the resin film is patterned to form a gap 522z, and the column-direction bank 522Y is formed (FIG. 13D). The gap 522z is formed by a process that an upper part of the resin film is masked, the resin film is exposed to light, and then developed. The column-direction banks 522Y extend along the top face of the insulating layer 122Y in the column direction, and are juxtaposed through the gaps 522z in the row direction.

(5) Formation of Hole Injection Layer 120 and Bank 122

Figure 11A:
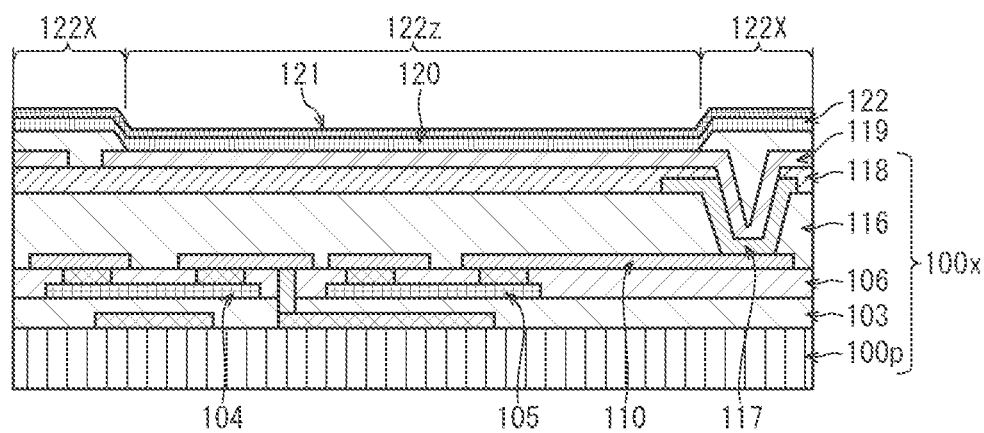
FIG. 11A is a schematic sectional view taken along the same line A1-A1 in FIG. 4B, illustrating a state at a step of forming a hole injection layer and a hole transport layer in production of the organic EL display panel.
Figure 14A:
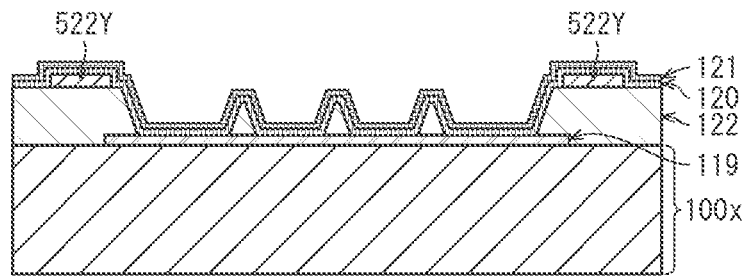
FIG. 14A is a schematic sectional view taken along the same line B-B in FIG. 4B, illustrating a state at a step of forming the hole injection layer and the hole transport layer in production of the organic EL display panel.
Figure 14B:
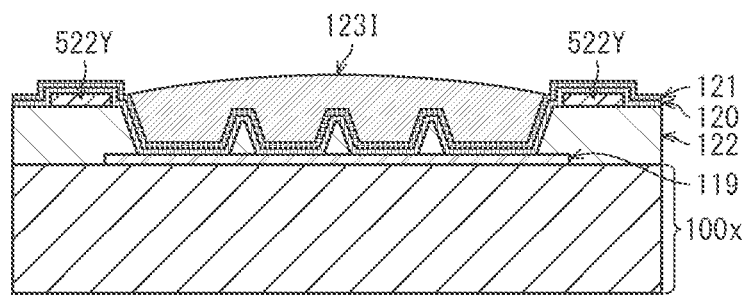
FIG. 14B is a schematic sectional view taken along the same line B-B in FIG. 4B, illustrating a state at a step of forming the luminous layer in production of the organic EL display panel.

The hole injection layer 120 and the hole transport layer 121 are formed on the pixel electrode layer 119, the insulating layer 122, and the column-direction bank 522Y (FIG. 11A and FIG. 14A). After a film made of a metal oxide (e.g. tungsten oxide) is formed by a sputtering method, the hole injection layer 120 and the hole transport layer 121 may be patterned by a pixel unit using a photolithography method and an etching method.

(6) Formation of Luminous Layer 123 and Electron Transport Layer 124

In each gap 522z demarcated by the column-direction bank 522Y, the luminous layer 123 and the electron transport layer 124 are sequentially laminated from the side of the hole transport layer 121.

The luminous layer 123 is formed by a process in which an ink containing constituent materials is applied into the gap 522z demarcated by the column-direction bank 522Y using an inkjet method before the ink is baked.

Figure 11B:
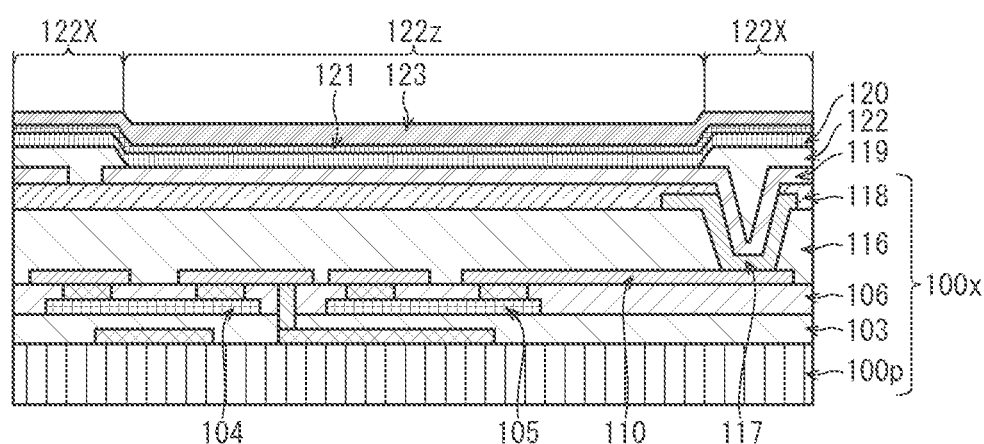
FIG. 11B is a schematic sectional view taken along the same line A1-A1 in FIG. 4B, illustrating a state at a step of forming a luminous layer in production of the organic EL display panel.
Figure 14C:
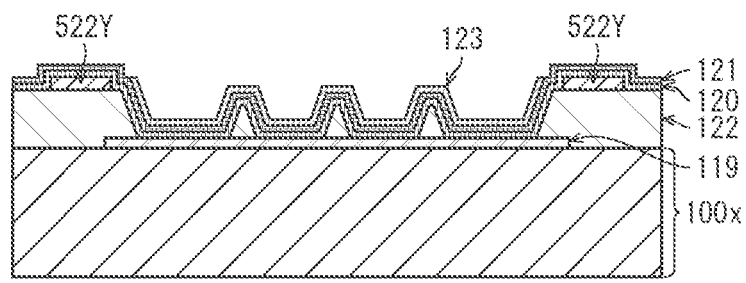
FIG. 14C is a schematic sectional view taken along the same line B-B in FIG. 4B, illustrating a state at a step of forming the luminous layer in production of the organic EL display panel.

For forming the luminous layer 123, first, a solution for forming the luminous layer 123 is applied using a droplet-discharging device. That is, a red luminous layer, a green luminous layer, and a blue luminous layer are repeatedly arranged in the lateral direction of the page of FIG. 14B on the substrate 100x. In this process, each of inks 123R1, 123G1, and 123B1 containing the material for any of R, G, and B organic luminous layers is charged into the gap 522z as a subpixel formation region by the inkjet method (FIG. 14B), the charged ink is dried under reduced pressure, and baked to form the luminous layers 123R, 123G, or 123B (FIG. 11B, FIG. 14C).

(Solution Application Method for Forming Luminous Layer)

Figure 16A:
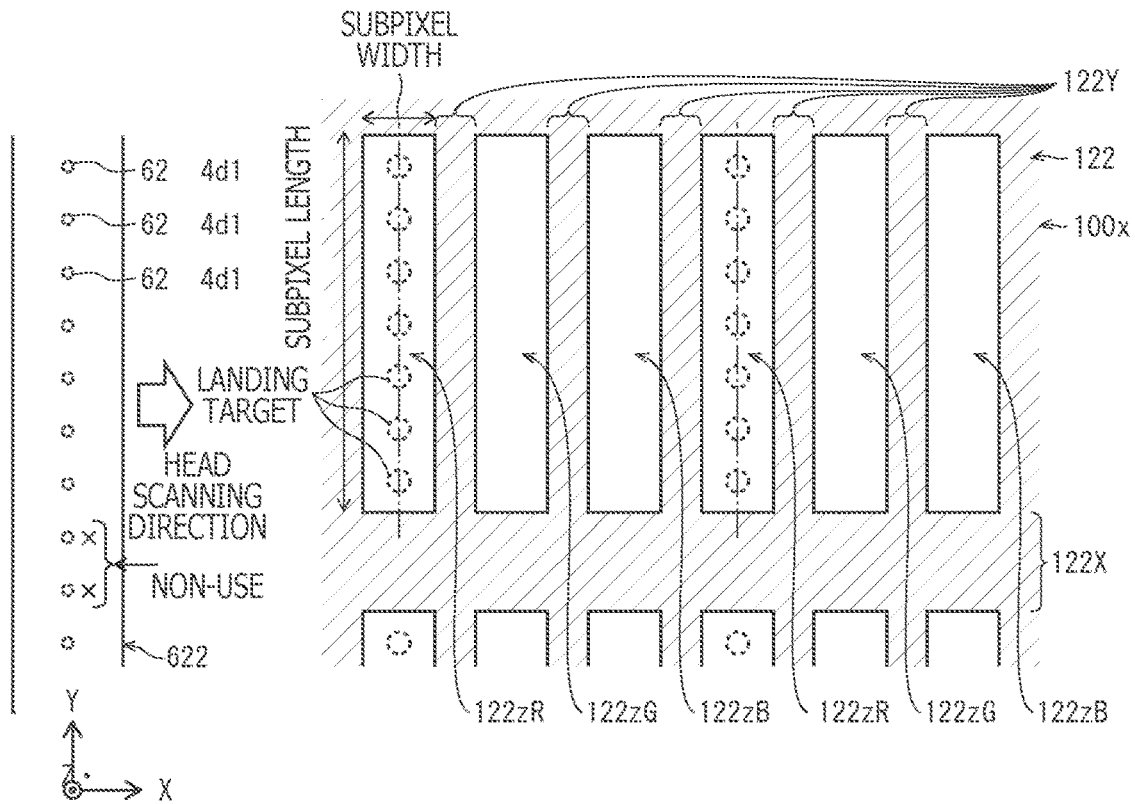
FIG. 16A is a diagram illustrating a step of applying the luminous layer-forming ink to the substrate in a production method for the organic EL display panel, in a case of a pixel bank.
Figure 16B:
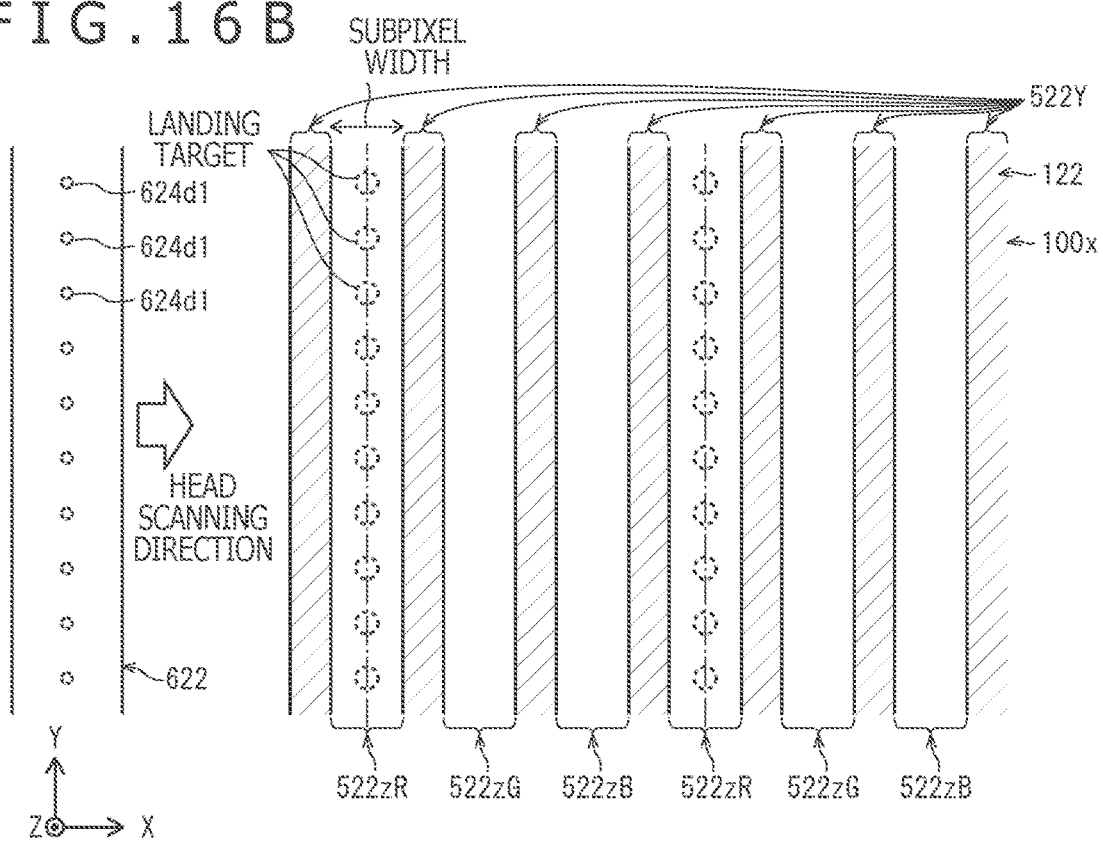
FIG. 16B is a diagram illustrating a step of applying the luminous layer-forming ink to the substrate in a production method for the organic EL display panel, in a case of a line bank.

A mass-production method for the process of forming the luminous layer 6 by the inkjet method will be explained. FIG. 16A and FIG. 16B are diagrams illustrating steps of applying the luminous layer-forming ink to the substrate, in which FIG. 16A illustrates a case where the ink is uniformly applied on the gap 522z between the column-direction banks 522Y, and FIG. 16B illustrates a case where the ink is applied on a grid-shaped region demarcated by the insulating layers 122X and 122Y.

In forming the luminous layer 123, three color inks (red ink 123RI, green ink 123GI, blue ink 123BI) which are solutions for forming the luminous layer 123 are used to form a red luminous layer, a green luminous layer, and a blue luminous layer in each region between a plurality of line banks.

For the purpose of simplifying the explanation, herein, three color inks are sequentially applied by a process in which first, one color ink is applied on a plurality of substrates, then another color ink is applied to the plurality of substrates, and then the third color ink is applied on the plurality of substrates.

Hereinafter, a process of applying one color ink (red ink) among the three color inks on the plurality of substrates will be explained as a representative.

[Case of Coating Grid-shaped Region Demarcated by Insulating Layers 122X and 122Y]

The ink is applied on the grid-shaped region demarcated by the insulating layers 122X and 122Y.

In this application method, as illustrated in FIG. 16A, the substrate 100x is set such that the longitudinal direction of each subpixel 100s is in the Y direction, and the width direction of each subpixel 100se is in the X direction. The ink is discharged from each discharge port toward a landing target set in the grid-shaped region demarcated by the insulating layers 122X and 122Y while scanning an inkjet head 622 in the X direction. In FIG. 16A, target positions on which the red ink is applied are indicated in the red subpixel 100se region.

However, among a plurality of discharge ports 624d1 included in the inkjet head 622, only discharge ports passing through the regions between the insulating layers 122X are used and discharge ports passing through the regions of the insulating layers 122X (discharge ports marked with crosses in FIG. 16A) are not used at all times. In the example illustrated in FIG. 16A, seven landing targets are set for one subpixel region, and ink droplets are discharged from seven discharge ports 624d1.

When application of an ink on the substrate 100x completes, another color ink is subsequently applied on the substrate, and then the third color ink is applied on the substrate. This process is repeated to sequentially apply the three color inks.

In the above description, when application of an ink on a plurality of substrates 100x completes, another color ink is subsequently applied on the plurality of substrates, and then the third color ink is applied on the plurality of the substrates. This process may be repeated to sequentially apply the three color inks.

[Case of Evenly Coating Gap 522z Between Column-Direction Banks 522Y]

The luminous layer 123 may continuously extend over not only the luminous region 100a but also the adjacent non-luminous region 100b. In this way, during formation of the luminous layer 123, the ink applied to the luminous region 100a can flow in the column direction through the ink which has been applied on the non-luminous region 100b, so that the film thickness can be leveled between the pixels in the column direction. However, flow of the ink is moderately suppressed by the insulating layer 122X in the non-luminous region 100b. Thus, significant unevenness in the film thickness is hardly caused in the column direction, and luminance unevenness among pixels is improved.

In the present application method, the substrate 100x is placed on a work table of the droplet-discharging device such that the column-direction bank 522Y is arranged along the Y direction, and the ink is discharged to target a landing target set in the gap 522z between the column-direction banks 522Y from each discharge port 624d1 while scanning the inkjet head 622 having a plurality of discharge ports 624d1 arranged in a line along the Y direction, as illustrated in FIG. 16B.

The present application method is special in that all the discharge ports 624d1 in the inkjet head 622 are used.

Note that the region on which the red ink is applied is one of three regions arranged adjacent to each other in the x direction.

When application of the ink on the substrate 100x completes, another color ink is subsequently applied on the substrate, and furthermore the third color ink is applied on the substrate. This process is repeated to sequentially apply the three color inks.

(7) Formation of Electron Transport Layer 124, Counter Electrode Layer 125, and Sealing Layer 126

Figure 11C:
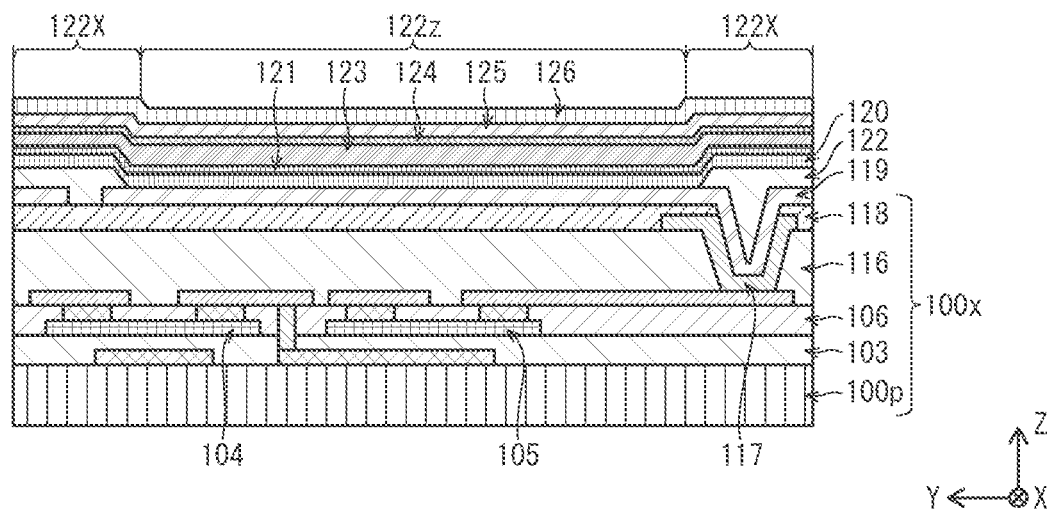
FIG. 11C is a schematic sectional view taken along the same line A1-A1 in FIG. 4B, illustrating a state at a step of forming an electron transport layer, a counter electrode layer, and a sealing layer in production of the organic EL display panel.
Figure 14D:
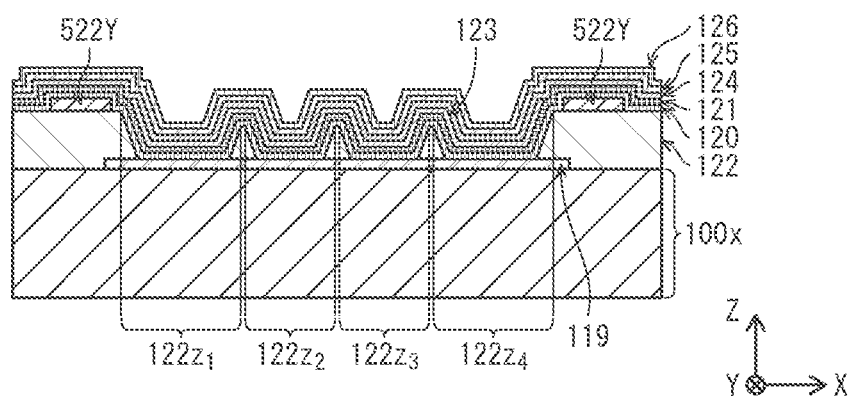
FIG. 14D is a schematic sectional view taken along the same line B-B in FIG. 4B, illustrating a state at a step of forming the electron transport layer, the counter electrode layer, and the sealing layer in production of the organic EL display panel.

The electron transport layer 124 is formed using a sputtering method or the like. Then, the counter electrode layer 125 and the sealing layer 126 are sequentially laminated so as to cover the electron transport layer 124 (FIG. 11C and FIG. 14D). The counter electrode layer 125 and the sealing layer 126 can be formed using a CVD method, a sputtering method, or the like.

(8) Formation of CF Substrate 131

Next, the manufacturing process of the CF substrate 131 will be explained using examples with reference to the drawings. FIGS. 17A, 17B, 17C, 17D, 17E and 17F are schematic sectional views illustrating a state in each production step of the CF substrate 131 in the production of the organic EL display panel 10.

Figure 17A:
FIG. 17A is a schematic sectional view illustrating a state at a step of producing the CF substrate in the production of the organic EL display panel.

A material for the light shielding layer 129 prepared by adding a black pigment to an ultraviolet curing resin (e.g. ultraviolet curing acrylic resin) material as a principal ingredient is dispersed in a solvent to prepare a light shielding layer paste 129R, which is applied on one side of a transparent top substrate 130 (FIG. 17A).

Figure 17B:
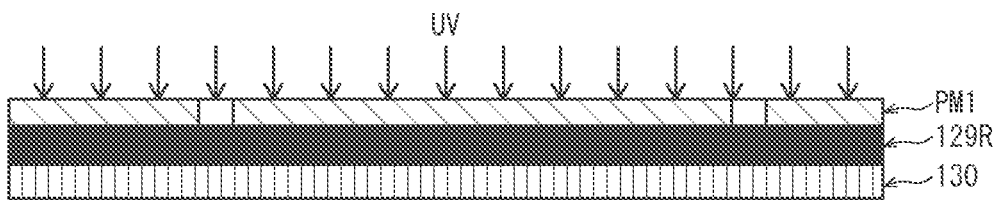
FIG. 17B is a schematic sectional view illustrating a state at a step of producing the CF substrate in the production of the organic EL display panel.

The applied light shielding layer paste 129R is dried to volatilize the solvent to some extent, and then a pattern mask PM1 having predetermined openings is laid on the paste 129R, which is irradiated with ultraviolet rays (FIG. 17B).

Figure 17C:
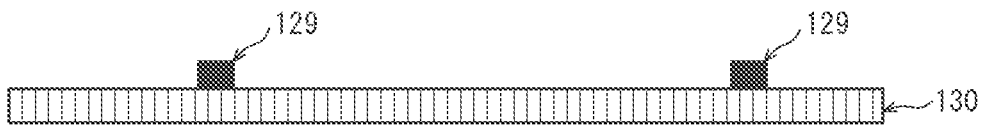
FIG. 17C is a schematic sectional view illustrating a state at a step of producing the CF substrate in the production of the organic EL display panel.

Subsequently, the light shielding layer paste 129R which has been applied and from which the solvent has been removed is baked, the pattern mask PM1 and the uncured light shielding layer paste 129R are removed, and the remaining light shielding layer paste 129R is developed and cured to complete the light shielding layer 129 having a rectangular cross-sectional shape (FIG. 17C).

Figure 17D:
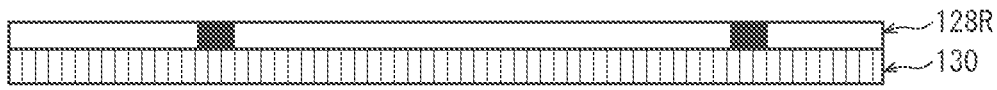
FIG. 17D is a schematic sectional view illustrating a state at a step of producing the CF substrate in the production of the organic EL display panel.

Next, a paste 128R prepared by dispersing a material for the color filter layer 128 (e.g. G) mainly composed of an ultraviolet curing resin component in a solvent is applied on the surface of the top substrate 130 having the light shielding layer 129, from which the solvent is removed to some extent, and then a predetermined pattern mask PM2 is laid on the paste 128R, which is irradiated with ultraviolet rays (FIG. 17D).

Figure 17E:
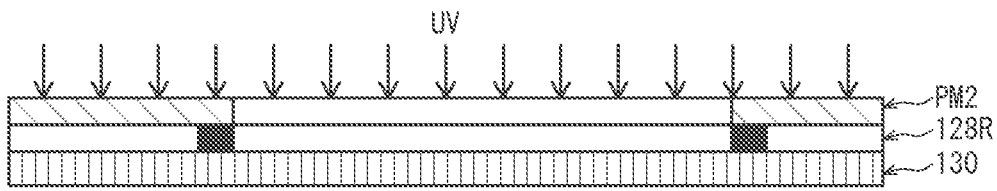
FIG. 17E is a schematic sectional view illustrating a state at a step of producing the CF substrate in the production of the organic EL display panel.
Figure 17F:
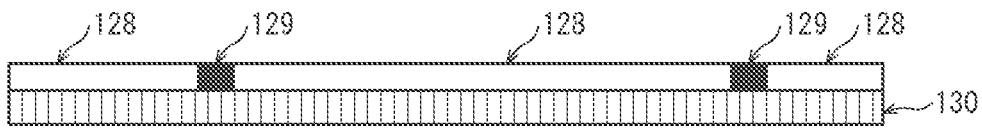
FIG. 17F is a schematic sectional view illustrating a state at a step of producing the CF substrate in the production of the organic EL display panel.

Subsequently, the paste 128R is cured, the pattern mask PM2 and the uncured paste 128R are removed, and the remaining paste 128R is developed to form the color filter layer 128(G) (FIG. 17E).

For each color filter material, the steps in FIG. 17D and FIG. 17E are similarly repeated to form the color filter layers 128(R) and 128(B). Incidentally, a commercially available color filter product may be used instead of the paste 128R.

As described hereinbefore, the CF substrate 131 is formed.

(9) Bonding of CF Substrate 131 with Back Panel

Figure 12A:
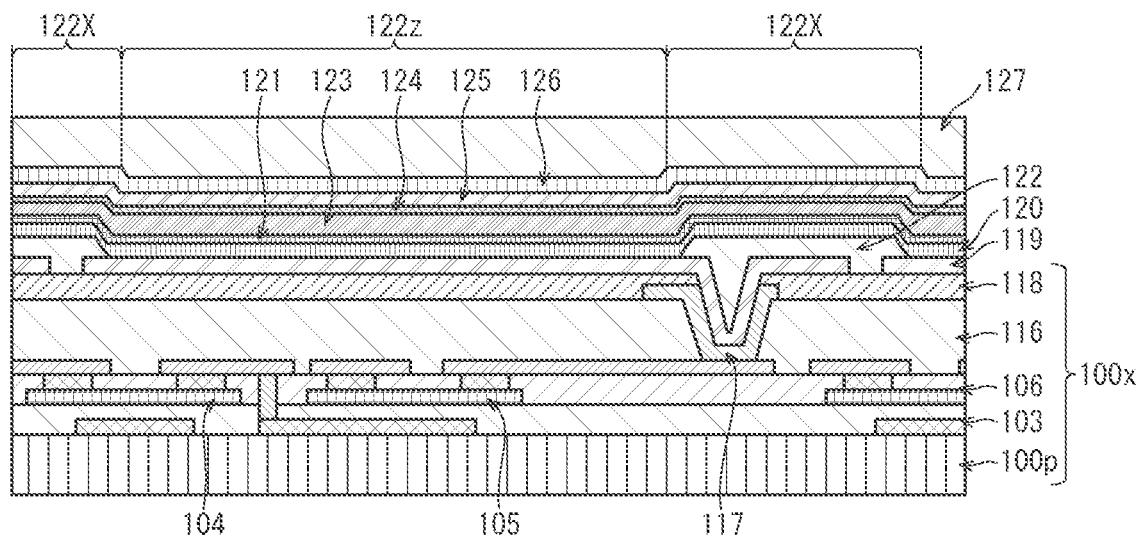
FIG. 12A is a schematic sectional view taken along the same line A1-A1 in FIG. 4B, illustrating a state at a step of forming a bonding layer in production of the organic EL display panel.
Figure 12B:
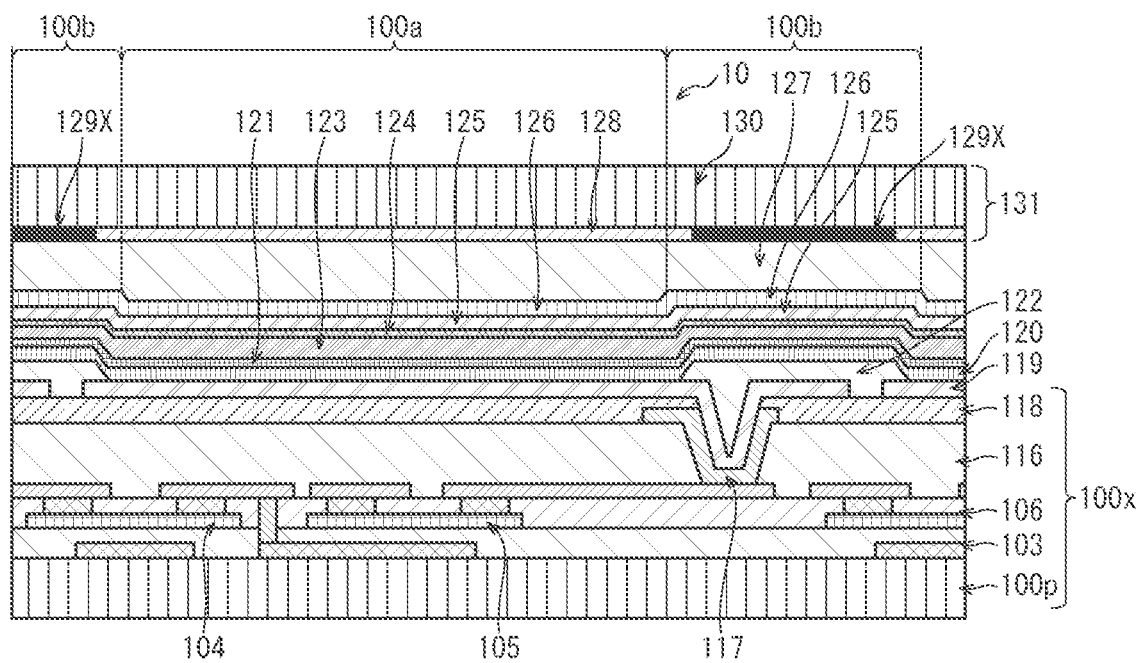
FIG. 12B is a schematic sectional view taken along the same line A1-A1 in FIG. 4B, illustrating a state at a step of bonding a color filter (CF) substrate in production of the organic EL display panel.

Next, a bonding process of the CF substrate 131 with a back panel in the production of the organic EL display panel will be explained. FIGS. 12A and 12B are schematic sectional views taken along the same line as A1-A1 in FIG. 4B, and FIGS. 15A and 15B are schematic sectional views taken along the same line as B-B in FIG. 4B.

First, a material for the bonding layer 127 mainly composed of a light transmissive ultraviolet curing resin such as an acrylic resin, a silicone resin, and an epoxy resin is applied on the back panel composed of respective layers from the substrate 100x to the sealing layer 126 (FIG. 12A, FIG. 15A).

Subsequently, the applied material is irradiated with ultraviolet rays, and the back panel and the CF substrate 131 are bonded with each other such that the relative positional relationship between the back panel and the CF substrate 131 is conformed. At this time, much attention should be paid not to let gas enter therebetween. Subsequently, the both substrates are baked to complete the sealing process, resulting in completion of the organic EL display panel 10 (FIG. 12B, FIG. 15B).

6. Shape of Reflector in Display Panel 10

Figure 18A:
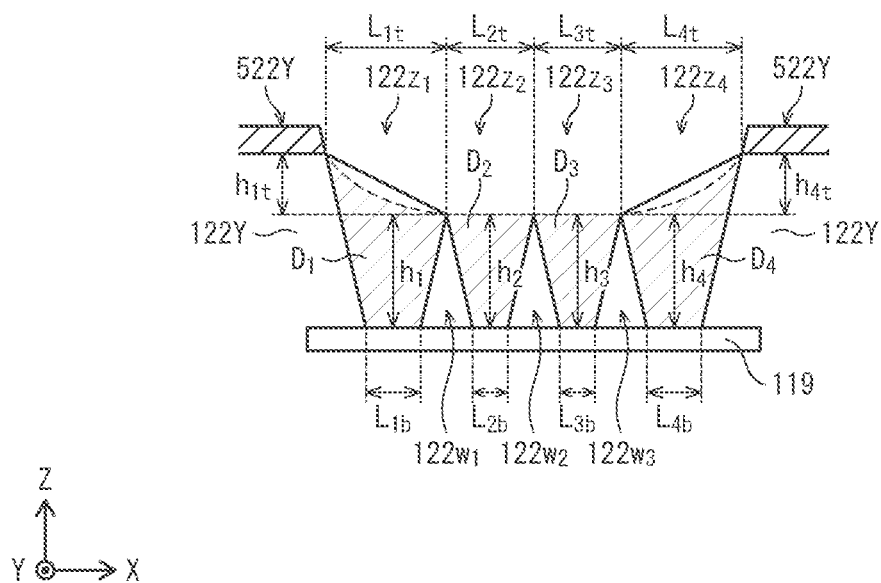
FIG. 18A is a schematic sectional view of the insulating layer, taken along the row direction.
Figure 18B:
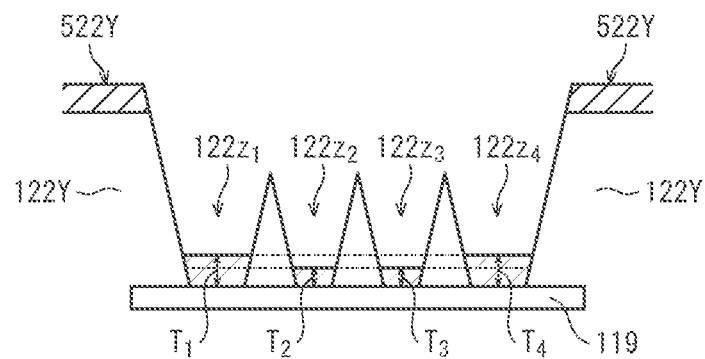
FIG. 18B is a schematic sectional view of the insulating layer, taken along the row direction in a conventional case.

(1) Relationship between Position of Opening and Film Thickness of Functional Layer Ununiformity in film thickness of the functional layers are compared and explained between the reflector structure according to the present embodiment and the conventional reflector structure, with reference to FIGS. 18A and 18B.

FIG. 18A is a schematic diagram illustrating a relationship between a cross section of the subpixel 100se cut along a face perpendicular to the Y axis and a pinning position of the applied ink. The volume of the ink applied on one subpixel becomes smaller as drying proceeds, and the drying is finished in each opening partitioned by the crosspieces 122w1, 122w2, and 122w3 to form the functional layer.

Thus, the film thickness of the functional layer formed in each opening is roughly proportional to a value obtained by dividing the volume of the opening by the bottom area of the opening.

Herein, since the shape of the opening is substantially symmetric with respect to the Y direction, the volume of the opening is proportional to the sectional area of the opening cut along the face perpendicular to the Y axis (hereinafter simply referred to as "Y-direction sectional area"), and the bottom area of the opening is proportional to an X-direction length of the bottom face of the opening cut along the face perpendicular to the Y axis (hereinafter simply referred to as "bottom face width"). Hence, when the Y-direction sectional area is defined as D and the bottom face length is defined as L, the film thickness of the functional layer is substantially proportional to an index value P defined by the following expression.

$$P=D/L$$

Herein, Y-direction sectional areas D1 to D4 of the respective openings 122$z$1 to 122$z$4 can be approximated using bottom face widths L1$b$ to L4$b$ of the respective openings, X-direction lengths L1$t$ to L4$t$ of the top face of the openings cut along the face perpendicular to the Y axis (hereinafter simply referred to as "top face width"), a difference h1$t$ between the levels of the top face of the crosspiece 122$w$1 and the interface between the insulating layer 122Y and the column-direction bank 522Y, and a difference h4$t$ between the levels of the top face of the crosspiece 122$w$3 and the interface between the insulating layer 122Y and the column-direction bank 522Y, as described hereinafter.

In the openings 122$z$2 and 122$z$3, the ink is pinned on the side walls of the crosspieces 122$w$1 to 122$w$3 at the levels of the top faces of the crosspieces 122$w$1 to 122$w$3. Thus, the Y-direction sectional areas D2 and D3 of the openings 122$z$2 and 122$z$3 can be approximated by determining a trapezoidal having a height as an opening height h2 or h3, a top side as a top face width L2$t$ or L3$t$, and a bottom side as a bottom area width L2$b$ or L3$b$. That is, the sectional areas can be approximated as described hereinafter.

$$D2=\tfrac{1}{2}\cdot h2\cdot(L2b+L2t)$$

$$D3=\tfrac{1}{2}\cdot h3\cdot(L3b+L3t)$$

On the other hand, in the openings 122$z$1 and 122$z$4, the ink is pinned on the side wall of the insulating layer 122Y at the level of the interface between the insulating layer 122Y and the column-direction bank 522Y. It is considered that the ink adhering to the wall face of the insulating layer 122Y on the upper part of the opening 122$z$1 remains in the opening 122$z$1 due to drying, and similarly it is considered that the ink adhering to the wall face of the insulating layer 122Y on the upper part of the opening 122$z$4 remains in the opening 122$z$4 due to drying. Thus, it should be considered that, in the openings 122$z$1 and 122$z$4, the sectional area includes not only the portion inside of the opening lower than the crosspieces 122$w$1 and 122$w$3 but also the portion along the insulating layer 122Y higher than the crosspieces 122$w$1 and 122$w$3. In other words, the Y-direction sectional areas D1 and D4 of the openings 122$z$1 and 122$z$4 can be approximated by totaling the same trapezoidal area as the Y-direction sectional areas D2 and D3 of the openings 122$z$2 and 122$z$3, and the portion raised along the side face of the insulating layer 122Y. It is considered that the sectional area of the portion raised along the side face of the insulating layer 122Y is larger than 0, and smaller than the area of the triangle having a bottom face as the top face width L1$t$ or L4$t$, and a height as the difference h1$t$ or h4$t$ between the level of the interface between the insulating layer 122Y and the column-direction bank 522Y and the level of the top face of the crosspieces 122$w$1 or 122$w$3, and thus can be approximated as follows.

$$\tfrac{1}{2}\cdot h1\cdot(L1b+L1t)<D1<\tfrac{1}{2}\cdot\{h1\cdot(L1b+L1t)+h1t\cdot L1t\}$$

$$\tfrac{1}{2}\cdot h4\cdot(L4b+L4t)<D4<\tfrac{1}{2}\cdot\{h4\cdot(L4b+L4t)+h4t\cdot L4t\}$$

If the heights of the crosspieces 122$w$1 to 122$w$3 are equal, the heights h1 to h4 of the respective openings 122$z$1 to 122$z$4 up to the crosspieces 122$w$1 to 122$w$3 are equal. In addition, if the inclinations of the side faces of the respective openings are equal, the differences between the top face widths and the bottom face widths of the openings are equal. Thus, if the bottom face widths of the openings are equal, that is, the following expression is satisfied, $$L1b=L2b=L3b=L4b$$

the top face widths are also equal, and the following expression is satisfied.

$$L1t=L2t=L3t=L4t$$

At this time, since the areas of the four trapezoids are equal, the following expression is satisfied.

$$D1=D4>D2=D3$$

Thus, the index values P1, P2, P3, and P4 of the respective openings have the following relationship.

$$P1=P4>P2=P3$$

That is, the larger the difference between the levels of the top faces of the crosspieces 122$w$1 to 122$w$3 and the level of the interface between the insulating layer 122Y and the column-direction bank 522Y is, the larger the difference between the amount of the functional layer material ink in the openings 122$z$1 and 122$z$4 adjacent to the column-direction bank 522Y, and the amount of the functional layer material ink in the other openings 122$z$2 and 122$z$3 is. Consequently, as illustrated in the schematic diagram of FIG. 18B, thicknesses T1 and T4 of the functional layers of the openings 122$z$1 and 122$z$4 are larger than thicknesses T2 and T3 of the functional layers of the openings 122$z$2 and 122$z$3.

(2) First Setting Policy

Figure 19A:
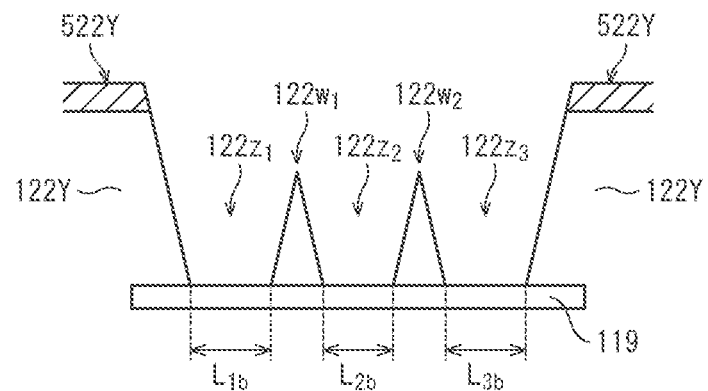
FIG. 19A is a schematic sectional view of the insulating layer according to the present embodiment, taken along the row direction.
Figure 19B:
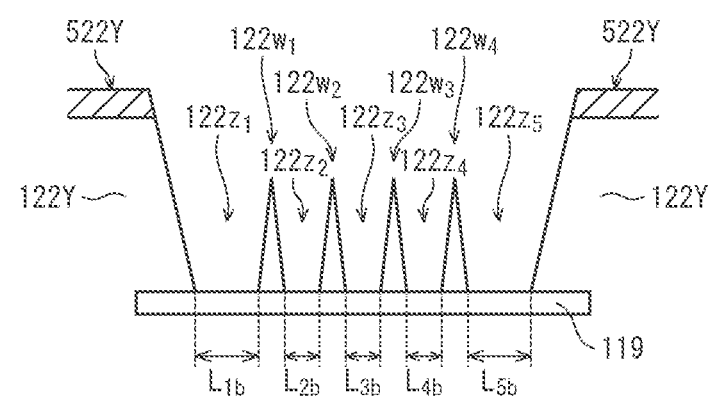
FIG. 19B is a schematic sectional view of the insulating layer according to the present embodiment, taken along the row direction.

In the first means for solving the above problems, the bottom face width of the opening adjacent to the column-direction bank 522Y is made larger than the bottom face width of the other opening, as illustrated in the schematic diagrams of FIGS. 19A and 19B. If the levels of the top faces of the crosspieces 122$w$1, 122$w$2, . . . are equal, the bottom areas of the crosspieces 122$w$1, 122$w$2, . . . are also equal, and thus the height and a difference ΔL between the top face length and the bottom face length are constant in every opening. Consequently, for the opening not adjacent to the column-direction bank 522Y, the following expressions are established.

$$P=D/Lt$$

$$=\tfrac{1}{2}\cdot h\cdot(Lb+Lt)\cdot 1/Lb$$

$$=h(1+\Delta L/2Lb)$$

That is, for the opening not adjacent to the column-direction bank 522Y, when the bottom face length Lb is increased while unchanging a height h, the index value P is decreased. In other words, if the ink adhering to the wall face of the insulating layer 122Y is ignored, the larger the opening width is, the thinner the film thickness of the formed functional layer is. Thus, when the bottom face length of the opening adjacent to the column-direction bank 522Y is made larger than the bottom face length of the other opening, the influence of the increased film thickness of the functional layer due to the ink adhered to the wall face of the insulating layer 122Y can be canceled by the decreased film thickness of the functional layer due to the increased opening width, to reduce the influence. FIG. 19A is a schematic diagram illustrating a case where the number of the openings per one subpixel 100se is 3, and it is preferable that the following expression is satisfied.

$$L1b=L3b>L2b$$

In addition, FIG. 19B is a schematic diagram illustrating a case where the number of openings per one subpixel 100se is 5, and it is preferable that the following expression is satisfied.

$$L1b=L5b>L2b=L3b=L4b$$

Incidentally, the number of openings per one subpixel 100se is not limited to the above cases, but may be any number of 3 or larger, for example, 4, or not less than 6.

(3) Second Setting Policy

Figure 20A:
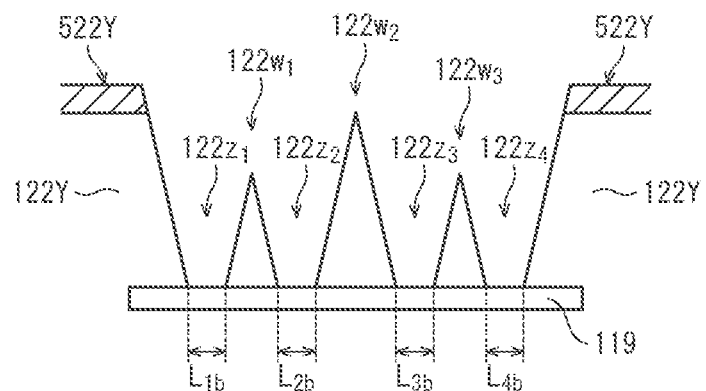
FIG. 20A is a schematic sectional view of the insulating layer according to the present embodiment, taken along the row direction.
Figure 20B:
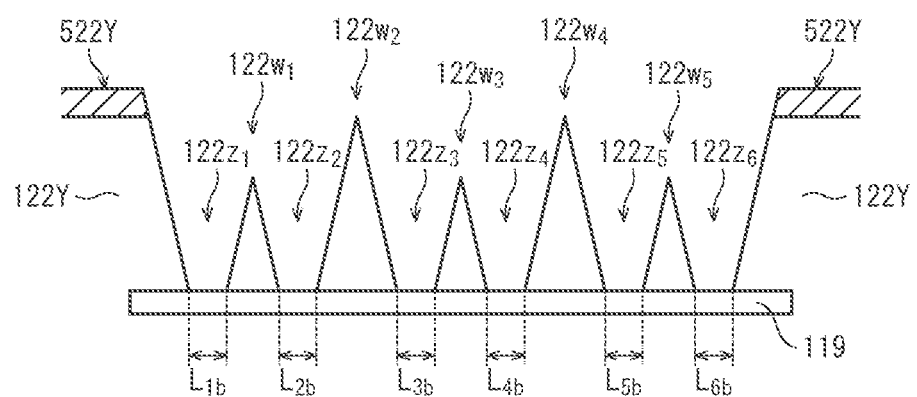
FIG. 20B is a schematic sectional view of the insulating layer according to the present embodiment, taken along the row direction.

As illustrated in the schematic diagrams of FIGS. 20A and 20B, in the second means for solving the above problems, which is different from the first means described hereinbefore, the number of the openings per one subpixel 100se is set to an even number. The crosspieces having heights lower than the interface between the insulating layer 122Y and the column-direction bank 522Y by looking from a vicinity of the insulating layer 122Y and the column-direction bank 522Y located at the odd-numbered positions, and the crosspieces having heights equal to the level of the interface between the insulating layer 122Y and the column-direction bank 522Y located at the even-numbered positions, are alternately arranged. FIG. 20A is a schematic diagram illustrating a case where the number of the openings per one subpixel 100se is 4. Herein, unlike the first means, respective bottom face lengths L1b, L2b, L3b, and L4b of the openings 122z1 to 122z4 are equal. On the other hand, the level of the top face of the crosspiece 122w2 is equal to the level of the interface between the insulating layer 122Y and the column-direction bank 522Y, and the levels of the top faces of the crosspieces 122w1 and 122w3 are equal and lower than the level of the top face of the crosspiece 122w2. By adopting such a shape, also in the opening 122z2 and the opening 122z3, the ink is pinned on the side wall of the crosspiece 122w2 at the level of the top face of the crosspiece 122w2, and thus the Y-direction sectional area D1 of the opening 122z1, the Y-direction sectional area D2 of the opening 122z2, the Y-direction sectional area D3 of the opening 122z3, and the Y-direction sectional area D4 of the opening 122z4 are equal. Since the bottom face lengths L1b, L2b, L3b, and L4b are equal to each other as described hereinbefore, respective index values P1, P2, P3, P4 of the openings 122z1 to 122z4 are equal.

Incidentally, such an insulating layer 122 can be achieved by the following method. In the method, the interval between the opening 122z2 and the opening 122z3 is widened, such that the height of the crosspiece 122w2 is made equal to that of the insulating layer 122Y, and the interval between the opening 122z1 and the opening 122z2 is made equal to the interval between the opening 122z3 and the opening 122z4, and the interval between the opening 122z2 and the opening 122z3 is narrowed, such that the heights of the crosspieces 122w1 and 122w3 are lower than the height of the crosspiece 122w2.

FIG. 20B is a schematic diagram illustrating a case where the number of the openings per one subpixel 100se is 6. Also in this case, the respective bottom face lengths L1b, L2b, L3b, L4b, L5b, and L6b of the openings 122z1 to 122z6 are equal. In addition, the levels of the top faces of the crosspieces 122w2 and 122w4 are equal to the level of the interface between the insulating layer 122Y and the column-direction bank 522Y, and the levels of the top faces of the crosspieces 122w1, 122w3, and 122w5 are equal and lower than the levels of the top faces of the crosspieces 122w2 and 122w4.

Note that the number of the openings per one subpixel 100se is not limited to the case described hereinbefore, but may be any even number of not less than 4, for example, an even number of not less than 8.

(3) Third Setting Policy

Figure 21A:
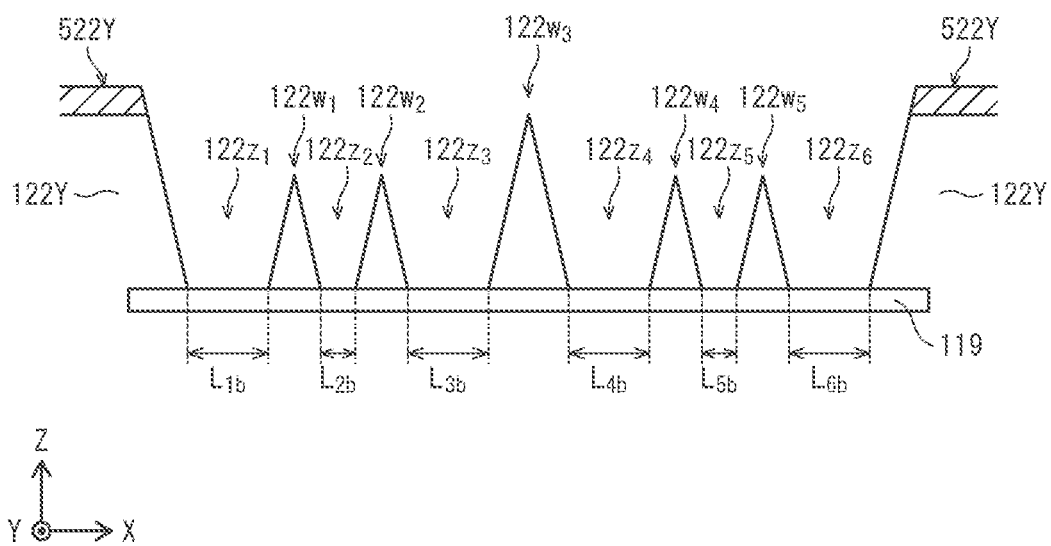
FIG. 21A is a schematic sectional view of the insulating layer according to the present embodiment, taken along the row direction.
Figure 21B:
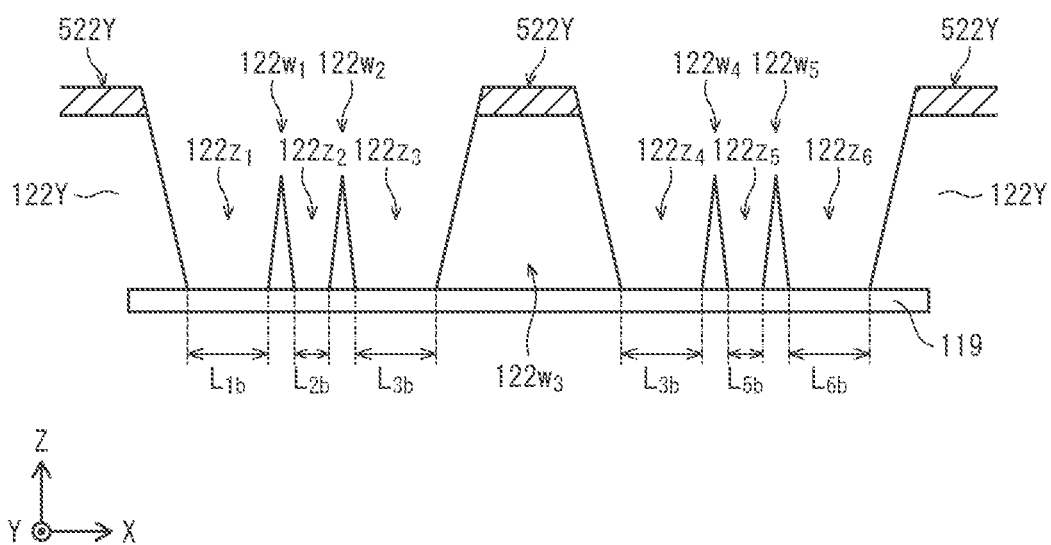
FIG. 21B is a schematic sectional view of the insulating layer according to the present embodiment, taken along the row direction.

As illustrated in the schematic diagrams of FIGS. 21A and 21B, in the third means for solving the above problems, which is different from the first and second means described hereinbefore, the number of the openings per one subpixel 100se is set to an even number, the height of the crosspiece at the center of the subpixel is made equal to the level of the interface between the insulating layer 122Y and the column-direction bank 522Y, and the same structure as that in the first means is provided in each of the two regions partitioned by the crosspiece and the insulating layer 122Y. FIG. 21A is a schematic diagram illustrating a case where the number of the openings per one subpixel 100se is 6. Herein, the crosspiece 122w3 positioned at the center of the subpixel 100se has a height equal to the level of the interface between the insulating layer 122Y and the column-direction bank 522Y. Regarding the openings 122z1, 122z2, and 122z3 positioned in the first region partitioned by the insulating layer 122Y and the crosspiece 122w3, the crosspieces 122w1 and 122w2 are lower than the crosspiece 122w3, and the respective bottom face lengths L1b and L3b of the openings 122z1 and 122z3 are equal, and are larger than the bottom face length L2b of the opening 122z2, as is the case with the first means. Similarly, regarding the openings 122z4, 122z5, and 122z6 positioned in the second region partitioned by the insulating layer 122Y and the crosspiece 122w3, the crosspieces 122w4 and 122w5 are lower than the crosspiece 122w3, and the respective bottom face lengths L4b and L6b of the openings 122z4 and 122z6 are equal, and larger than the bottom face length L2b of the opening 122z2, as is the case with the first means. Regarding the bottom face length, it is preferable that the following expression is satisfied.

$$L1b=L3b=L4b=L6b>L2b=L5b$$

Since the applied ink does not need to overtake the crosspiece at the center of the subpixel, for example, as illustrated in FIG. 21B, the height of the crosspiece 122w3 at the center of the subpixel may be made equal to that of the insulating layer 122Y, and the column-direction bank 522Y may also be disposed directly on the crosspiece 122w3 at the center of the subpixel, so that the crosspiece 122w3 at the center of the subpixel has the same structure as of the line bank. It is enough that the crosspiece 122w3 at the center of the subpixel is as high as the insulating layer 122Y, and the widths of them in the X direction may be equal or different from each other.

Note that the number of the openings per one subpixel 100se is not limited to the case described hereinbefore, but may be any even number of not less than 6, for example, an even number of not less than 8. Although not illustrated, the subpixel 100se may be equally divided in the X direction by using three or more crosspieces having a height equal to the level of the interface between the insulating layer 122Y and the column-direction bank 522Y, such that each region of the subpixel 100se has the same structure as of the first means. That is, the number of openings corresponds to a product of two numbers p and q (p is an integer of not less than 3, and q is an integer of not less than 2), and the heights of the crosspieces at positions of numbers of integral multiples of p from the insulating layer 122Y and the column-direction bank 522Y are made equal to the level of the interface between the insulating layer 122Y and the column-direction bank 522Y, and the heights of the other crosspieces are made lower than the interface, and furthermore the widths of the openings adjacent to the higher crosspieces i.e. the crosspieces at positions of numbers of integral multiples of p are made larger than those of the other openings.

(4) Summary

As described hereinbefore, the reflector shape according to the present embodiment can prevent ununiformity in the film thicknesses of the functional layers in the plurality of openings formed in one pixel. Thus, in a plurality of micropixels connected in parallel and controlled as one subpixel, it is possible to prevent the electric characteristics from varying among the micropixels. That is, ununiformity in luminance and lifetime among the micropixels can be avoided, the light extraction efficiency can be improved by the reflector, and efficiency improvement and lifetime extension for the organic EL element can be achieved. Additionally, in relation to the reflector shape according to the present embodiment, at least one crosspiece is lower than the column-direction bank. This case can therefore improve the aperture ratio compared to a case where the heights of all crosspieces are made equal to the height of the column-direction bank, whereby the luminescence intensity per unit area of the organic EL element can be increased.

7. Shape of Other Opening

As for the reflector shape according to the present embodiment, it has been described that the opening has a slit-like shape extending in the same direction as the extending direction of the column-direction bank, but the shapes of other openings may be similarly designed.

Figure 22B:
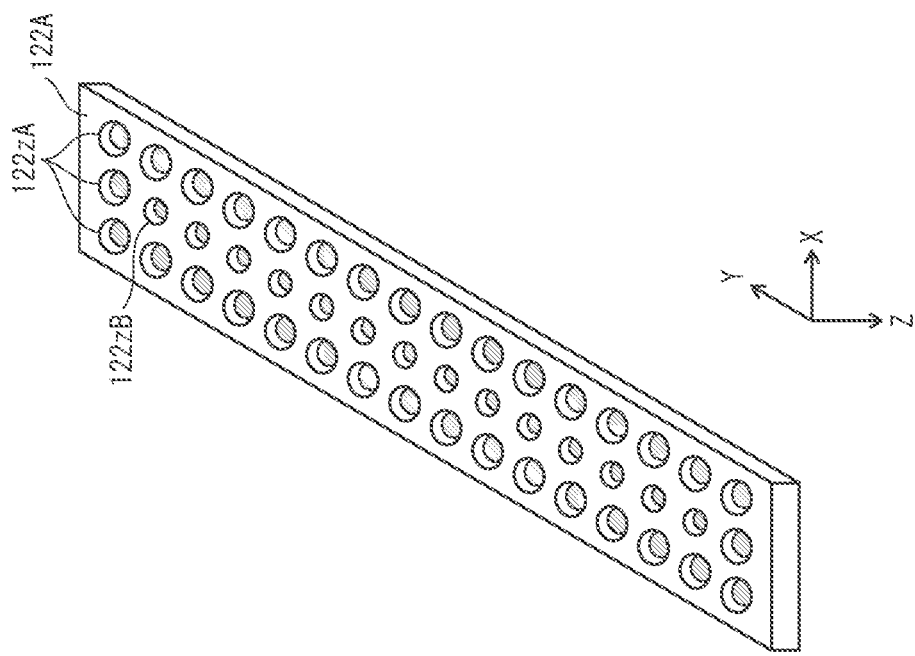
FIG. 22B is a perspective view of the conventional insulating layer.
Figure 22A:
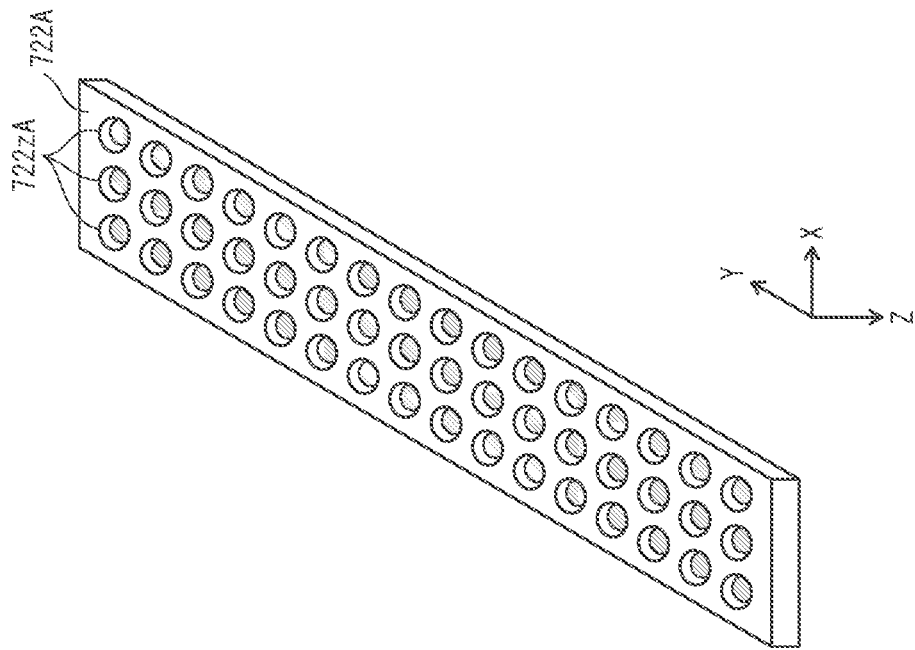
FIG. 22A is a perspective view of the insulating layer.

For example, for the reflector in which openings 722zA formed in a circular truncated cone shape in the plan view direction are arranged in the column and row directions as illustrated in FIG. 22B, the diameters of the openings arranged close to the column-direction bank may be made larger than the diameters of the other openings, and the respective index values P of the openings may be equal. Additionally, in a so-called pixel bank method in which the subpixels are partitioned similarly in the row direction and the column direction, the diameters of the openings arranged close to the bank may be made larger than the diameters of the other openings, and the respective index values P of the openings may be equal. Specifically, as illustrated in FIG. 22A, the diameters of the openings 122zA disposed on the outer periphery of the insulating layer are made smaller than the diameters of the other openings 122zB disposed on the inner side. This makes it possible to uniformize the film thickness of the functional layer formed in the opening.

«Other Variations»

Although the display panel 10 according to the present embodiment has been explained in the embodiments, the present disclosure is not limited to the above embodiments except for the essential characteristic constituent elements. For example, the present disclosure includes a configuration obtained by providing various modifications as conceived by any person skilled in the art to the respective embodiments, and a configuration achieved by arbitrarily combining the constituent elements and functions in the respective embodiments without departing from the gist of the present disclosure. Hereinafter, as an example of such a configuration, a variation of the display panel 10 will be explained.

(1) The display panel 10 according to the present embodiment has a configuration in which the CF substrate 131 on which the light shielding layers 129X and 129Y are laid is disposed and bonded onto the back panel composed of the respective layers from the substrate 100x to the sealing layer 126. However, in the illustrated display panel 10, the light shielding layers 129X and 129Y may be configured to be directly disposed on the back panel.

(2) The display panel 10 has a configuration in which the luminous layer 123 continuously extends in the column direction on the row-direction bank. However, in the above configuration, the luminous layer 123 may be configured to be intermittently disposed for each pixel on the row-direction bank.

(3) The display panel 10 has a configuration in which colors of lights emitted from the luminous layers 123 of the subpixels 100se disposed on the gaps 522z between the column-direction banks 522Y adjacent to each other in the row direction are different from each other, and colors of lights emitted from the luminous layers 123 of the subpixels 100se disposed on the gaps 522z between the row-direction banks adjacent to each other in the column direction are the same. However, in the above configuration, the colors of the lights emitted from the luminous layers 123 of the subpixels 100se adjacent to each other in the row direction may be the same, and the colors of the lights emitted from the luminous layers 123 of the subpixels 100se adjacent to each other in the column direction may be different from each other. Also, the display panel 10 may have a configuration in which the colors of the lights emitted from the luminous layers 123 of the subpixels 100se adjacent to each other in both the row and column directions may be different from each other.

(4) The display panel 10 has a configuration in which the CF substrate 131 is disposed and bonded onto the back panel composed of the respective layers from the substrate 100x to the sealing layer 126 through the bonding layer 127. Furthermore, the display panel 10 may have a configuration in which a photo spacer is interposed between the top of the back panel and the CF substrate 131.

(5) In respective organic EL display panels according to the embodiments and the variations, when a refractive index of the bonding layer 127 is defined as n1 and a refractive index of the insulating layer 122 is defined as n2, expressions $1.1 \leq n1 \leq 1.8$ and $\oplus n1-n2| \geq 0.20$ are satisfied, and when an inclination of the reflector slope is defined as θ, expressions $n2<n1$ and $75.2-54(n1-n2) \leq \theta \leq 81.0-20(n1-n2)$ are satisfied. However, in two layers among a plurality of layers from the insulating layer 122 to the bonding layer 127, a refractive index of the layer on the side of the color filter layer 128 is defined as n3 and a refractive index of the layer on the side of the pixel electrode layer 119 is defined as n4, expressions $1.1 \leq n3 \leq 1.8$ and $|n3-n4| \geq 0.20$ may be satisfied, and when an inclination of the reflector slope is defined as θ, expressions $n4<n3$ and $75.2-54(n3-n4) \leq \theta \leq 81.0-20(n3-n4)$ may be satisfied.

(6) Other Variation

In the display panel 10 according to the present embodiment, the subpixel 100se includes three types of pixels: a red pixel, a green pixel, and a blue pixel, but the present disclosure is not limited thereto. For example, there may be one type of luminous layer, and only one type of subpixel, or there may be four types of luminous layers emitting a red light, green light, blue light, and yellow light, and four types of subpixels. In addition, one type of subpixel may have two or more luminous layers, for example, a subpixel emitting yellow light may include a red luminous layer and a green luminous layer. In addition, it may be achieved that the number of types of subpixels is more than the number of types of the luminous layers by combination with color filters, and, for example, each of a red pixel, a green pixel, and a blue pixel may be achieved by combining a white luminous layer with a red transmissive filter, a green transmissive filter, or a blue transmissive filter respectively. In addition, the unit pixel 100*e* is not necessarily composed of a plurality of subpixels 100*se*. For example, the unit pixel 100*e* may be composed of one subpixel 100*se*, and the unit pixel 100*e* may have the same structure as the subpixel 100*se* according to the present embodiment.

In the above embodiment, the display panel 10 has the configuration in which the unit pixels 100*e* and the subpixels 100*se* constituting the unit pixels 100*e* are arranged in matrix, but the present disclosure is not limited thereto. For example, the display panel 10 may have a configuration in which, when the interval between the pixel regions is defined as one pitch, the pixel regions are deviated from each other by a half pitch in the column direction between adjacent gaps.

In addition, in the display panel 10, the pixel electrode layers 119 are disposed in all the gaps 522*z*, but the present disclosure is not limited to this configuration. For example, for the purpose of forming a bus bar or the like, there may be the gap 522*z* without the pixel electrode layer 119.

Also, the display panel 10 has a configuration in which the color filter layer 128 is formed above the gap 522*z* that is each color subpixel 100*se*. However, the illustrated display panel 10 may have a configuration in which the color filter layer 128 is not disposed above the gap 522*z*.

In the above embodiment, the configuration in which the hole injection layer 120, the hole transport layer 121, the luminous layer 123, and the electron transport layer 124 are disposed between the pixel electrode layer 119 and the counter electrode layer 125 is adopted, but the present disclosure is not limited to this configuration. For example, a configuration in which only the luminous layer 123 is disposed between the pixel electrode layer 119 and the counter electrode layer 125 without using the hole injection layer 120, the hole transport layer 121, and the electron transport layer 124 may be adopted. Furthermore, for example, a configuration including a hole injection layer, a hole transport layer, an electron transport layer, an electron injection layer, and the like, or a configuration including a plurality of or all of these members at a time may be adopted. In addition, all of these layers are not necessarily composed of organic compounds, but may be composed of inorganic substances and the like. The method for forming the hole injection layer 120, the hole transport layer 121, and the electron transport layer 124 may be a dry-type film formation process such as a vacuum deposition method, an electron beam deposition method, a sputtering method, a reactive sputtering method, an ion plating method, and a vapor growth method. Furthermore, when the hole injection layer 120 and the hole transport layer 121 are formed by the dry-type film formation process, the pixel electrode layer 119, the hole injection layer 120, the hole transport layer 121, the insulating layer 122, and the luminous layer 123 may be laminated in this order.

In the above embodiment, the configuration in which the pixel electrode layer 119 as an anode is disposed under the EL element portion and the pixel electrode layer 119 is connected to the source electrode 110 of the TFT is adopted, but a configuration in which the counter electrode layer is disposed on the lower part of the EL element portion, and the anode is disposed on the upper part of the EL element portion can be adopted. In this case, a cathode disposed on the lower part of the EL element portion is connected to the drain in the TFT.

Additionally, in the above embodiment, the configuration in which two transistors Tr1 and Tr2 are disposed for one subpixel 100*s* is adopted, but the present disclosure is not limited to this configuration. For example, a configuration in which one transistor is disposed for one subpixel may be adopted, or a configuration in which not less than three transistors are disposed for one subpixel may be adopted.

Furthermore, in the above embodiment, the top emission type EL display panel is taken as an example, but the present disclosure is not limited thereto. For example, the present disclosure can be applied also to a bottom emission type display panel or the like. In this case, appropriate modifications can be made for each configuration.

In the above embodiment, the display panel 10 has the active matrix type configuration, but the present disclosure is not limited thereto, and the display panel 10 may have, for example, a passive matrix type configuration. Specifically, a plurality of linear electrodes parallel to the column direction and a plurality of linear electrodes parallel to the row direction may be juxtaposed so as to sandwich the luminous layer 123. In this case, appropriate modifications can be made for each configuration. In the above embodiment, the substrate 100*x* is configured to have the TFT layer, but the substrate 100*x* is not limited to the configuration with the TFT layer as can be seen from the example of the passive matrix type, and the like.

«Supplement»

The embodiments explained hereinbefore merely present preferable specific examples of the present disclosure. The numerical values, shapes, materials, constituent elements, arrangement positions and connection configurations of constituent elements, processes, order of processes, and the like described in the embodiments are merely examples and are not intended to limit the present disclosure. Among the constituent elements in the embodiments, processes not described in the independent claims presenting the topmost concept of the present disclosure are explained as any constituent elements constituting more preferable configurations.

In addition, the order for carrying out the processes is intended to specifically illustrate the present disclosure, and may be an order other than the order described hereinbefore. Furthermore, some of the processes may be executed simultaneously (in parallel) with the other processes.

In addition, for the purpose of facilitating understanding of the disclosure, the scale of the constituent elements in each figure cited in each embodiment described hereinbefore is different from the actual scale in some cases. In addition, the present disclosure is not limited by the description of each embodiment described hereinbefore, and can be appropriately modified without departing from the gist of the present disclosure.

In addition, at least some functions of the respective embodiments and the variations thereof may be combined.

Furthermore, the present disclosure also includes variations in which modifications are made within the scope of the concept of those skilled in the art for the present embodiment.

INDUSTRIAL APPLICABILITY

The organic EL display panel and the organic EL display device according to the present disclosure can be widely used for apparatuses such as a television set, a personal computer, and a mobile phone, or various other electronic equipment having display panels.

The present disclosure contains subject matter related to that disclosed in Japanese Priority Patent Application JP 2018-079914 filed in the Japan Patent Office on Apr. 18, 2018, the entire content(s) of which is(are) hereby incorporated by reference.

What is claimed is:

1. An organic electroluminescence display panel, comprising:
    a plurality of pixels in a matrix;
    a substrate;
    a plurality of pixel electrodes on the substrate for each of the plurality of pixels;
    insulating layers disposed so as to cover each upper part of the plurality of pixel electrodes, wherein the insulating layers have at least three slit-shaped openings extending in a column direction and arranged in the column direction;
    a plurality of partition walls extending in the column direction and partitioning the plurality of pixel electrodes in a row direction;
    a plurality of organic functional layers on the plurality of pixel electrodes and including a plurality of organic luminous layers configured to cause electroluminescence in each of the at least three slit-shaped openings; and
    light transmissive counter electrodes on upper parts of the plurality of organic functional layers, wherein
        levels of top faces of the plurality of partition walls with respect to the plurality of pixel electrodes are higher than levels of top faces of the insulating layers with respect to the plurality of pixel electrodes, and
        row-direction widths of openings adjacent to the plurality of partition walls in the row direction on bottom faces of the insulating layers are larger than row-direction widths of openings that are not adjacent to the plurality of partition walls in the row direction.

2. The organic electroluminescence display panel according to claim 1, wherein
    the plurality of organic luminous layers further including:
        a first organic luminous layer to emit light with a first luminescent color; and
        a second organic luminous layer to emit light with a second luminescent color, and
    a first pixel electrode of the plurality of pixel electrodes on which the first organic luminous layer is disposed is partitioned from a second pixel electrode of the plurality of pixel electrodes on which the second organic luminous layer is disposed by a partition wall of the plurality of partition walls.

3. The organic electroluminescence display panel according to claim 1, wherein
    a number of openings in a first pixel of the plurality of pixels and a number of openings in a second pixel of the plurality of pixels adjacent to the first pixel in the column direction are equal, and
    at least one opening of the openings in the first pixel communicates with at least one opening of the openings in the second pixel adjacent to the first pixel in the column direction.

4. The organic electroluminescence display panel according to claim 3, wherein the openings in the first pixel communicate between the first pixel and the second pixel adjacent to the first pixel in the column direction.

5. An organic electroluminescence display device, comprising:
    an organic electroluminescence display panel, comprising:
        a plurality of pixels in a matrix;
        a substrate;
        a plurality of pixel electrodes on the substrate for each of the plurality of pixels;
        insulating layers disposed so as to cover each upper part of the plurality of pixel electrodes, wherein the insulating layers have at least three slit-shaped openings extending in a column direction and arranged in the column direction;
        a plurality of partition walls extending in the column direction and partitioning the plurality of pixel electrodes in a row direction;
        a plurality of organic functional layers on the plurality of pixel electrodes and including a plurality of organic luminous layers configured to cause electroluminescence in each of the at least three slit-shaped openings; and
        light transmissive counter electrodes on upper parts of the plurality of organic functional layers, wherein
            levels of top faces of the plurality of partition walls with respect to the plurality of pixel electrodes are higher than levels of top faces of the insulating layers with respect to the plurality of pixel electrodes, and
            row-direction widths of openings adjacent to the plurality of partition walls in the row direction on bottom faces of the insulating layers are larger than row-direction widths of openings that are not adjacent to the plurality of partition walls in the row direction.

6. The organic electroluminescence display panel according to claim 1, wherein
    the insulating layers include two cross-pieces,
    the plurality of partition walls includes a first partition wall and a second partition wall extending in the column direction,
    the at least three slit-shaped openings are between the first partition wall and the second partition wall,
    the two cross-pieces includes a first cross-piece and a second cross-piece positioned between the at least three slit-shaped openings in the row direction,
    the first cross-piece is adjacent to the first partition wall and the second cross-piece is adjacent to the second partition wall,
    a row-direction width between the first cross-piece and the first partition wall is equal to a row-direction width between the second cross-piece and the second partition wall, and
    a row-direction width between the first cross-piece and the second cross-piece is smaller than the row-direction width between the first cross-piece and the first partition wall.

* * * * *